United States Patent
Wang

(10) Patent No.: US 7,732,881 B2
(45) Date of Patent: Jun. 8, 2010

(54) CURRENT-CONFINED EFFECT OF MAGNETIC NANO-CURRENT-CHANNEL (NCC) FOR MAGNETIC RANDOM ACCESS MEMORY (MRAM)

(75) Inventor: Jianping Wang, Shoreview, MN (US)

(73) Assignee: Avalanche Technology, Inc., Fremont, CA (US)

( * ) Notice: Subject to any disclaimer, the term of this patent is extended or adjusted under 35 U.S.C. 154(b) by 265 days.

(21) Appl. No.: 11/932,940

(22) Filed: Oct. 31, 2007

(65) Prior Publication Data

US 2008/0180991 A1    Jul. 31, 2008

Related U.S. Application Data

(60) Provisional application No. 60/863,812, filed on Nov. 1, 2006.

(51) Int. Cl.
H01L 29/82    (2006.01)

(52) U.S. Cl. ............... 257/421; 257/295; 257/E27.006; 365/158; 365/171; 365/173

(58) Field of Classification Search ............ 257/421, 257/E27.006, 295; 365/158, 171, 173
See application file for complete search history.

(56) References Cited

U.S. PATENT DOCUMENTS

| | | | |
|---|---|---|---|
| 3,665,264 A | 5/1972 | Yukami et al. |
| 5,060,098 A | 10/1991 | Gotoh et al. |
| 5,695,864 A | 12/1997 | Slonczewski |
| 6,072,718 A | 6/2000 | Abraham et al. |
| 6,169,689 B1 | 1/2001 | Naji |
| 6,285,581 B1 | 9/2001 | Tehrani et al. |
| 6,365,419 B1 | 4/2002 | Durlam et al. |
| 6,421,270 B1 | 7/2002 | Tai |
| 6,469,926 B1 | 10/2002 | Chen |
| 6,501,139 B1 | 12/2002 | Petti |
| 6,590,806 B1 | 7/2003 | Bhattacharyya |
| 6,603,677 B2 | 8/2003 | Redon et al. |
| 6,639,312 B2 | 10/2003 | Herner et al. |

(Continued)

FOREIGN PATENT DOCUMENTS

JP    2002197851 A    7/2002

(Continued)

OTHER PUBLICATIONS

T. Sek et al.; Spin-polarized current-induced magnetization reversal in perpendicularly magnetized L10-FePt layers; Applied Physics Letters; 88, 172504 2006 ; Apr. 25, 2006.

(Continued)

*Primary Examiner*—Tu-Tu V Ho
(74) *Attorney, Agent, or Firm*—Maryam Imam; IPxLaw Group LLP

(57) ABSTRACT

One embodiment of the present invention includes a memory element having a composite free layer including a first free sub-layer formed on top of the bottom electrode, a nano-current-channel (NCC) layer formed on top of the first free sub-layer, and a second free sub-layer formed on top of the NCC layer, wherein when switching current is applied to the memory element, in a direction that is substantially perpendicular to the layers of the memory element, local magnetic moments of the NCC layer switch the state of the memory element.

29 Claims, 7 Drawing Sheets

U.S. PATENT DOCUMENTS

| | | |
|---|---|---|
| 6,642,595 B1 | 11/2003 | Hung et al. |
| 6,649,451 B1 | 11/2003 | Vyvoda et al. |
| 6,670,660 B2 | 12/2003 | Hosotani |
| 6,697,294 B1 | 2/2004 | Qi et al. |
| 6,714,444 B2 | 3/2004 | Huai et al. |
| 6,724,585 B2 | 4/2004 | Hayashi |
| 6,743,642 B2 | 6/2004 | Costrini et al. |
| 6,744,086 B2 | 6/2004 | Daughton et al. |
| 6,759,263 B2 | 7/2004 | Ying et al. |
| 6,783,999 B1 | 8/2004 | Lee |
| 6,821,907 B2 | 11/2004 | Hwang et al. |
| 6,893,893 B2 | 5/2005 | Nallan et al. |
| 6,905,578 B1 | 6/2005 | Moslehi et al. |
| 6,920,063 B2 | 7/2005 | Huai et al. |
| 6,933,155 B2 | 8/2005 | Albert et al. |
| 6,964,928 B2 | 11/2005 | Ying et al. |
| 6,984,561 B2 | 1/2006 | Herner et al. |
| 6,984,585 B2 | 1/2006 | Ying et al. |
| 6,985,385 B2 | 1/2006 | Nguyen et al. |
| 6,992,359 B2 | 1/2006 | Nguyen et al. |
| 6,995,422 B2 | 2/2006 | Herner et al. |
| 7,002,781 B2 | 2/2006 | Sugawara |
| 7,005,730 B2 | 2/2006 | Verma et al. |
| 7,009,877 B1 | 3/2006 | Huai et al. |
| 7,018,878 B2 | 3/2006 | Vyvoda et al. |
| 7,023,725 B2 | 4/2006 | Saito et al. |
| 7,023,739 B2 | 4/2006 | Chen et al. |
| 7,026,673 B2 | 4/2006 | Abraham |
| 7,057,921 B2 | 6/2006 | Valet |
| 7,088,609 B2 | 8/2006 | Valet |
| 7,106,624 B2 | 9/2006 | Huai et al. |
| 7,109,539 B2 | 9/2006 | Lu |
| 7,120,049 B2 | 10/2006 | Nakamura et al. |
| 7,123,498 B2 | 10/2006 | Miyatake et al. |
| 7,126,201 B2 | 10/2006 | Matsutera et al. |
| 7,148,531 B2 | 12/2006 | Daughton et al. |
| 7,170,775 B2 | 1/2007 | Lin et al. |
| 7,183,130 B2 | 2/2007 | Nuetzel et al. |
| 2002/0048128 A1 | 4/2002 | Kamiguchi et al. |
| 2003/0108776 A1 | 6/2003 | Chang et al. |
| 2003/0123200 A1 | 7/2003 | Nagasaka et al. |
| 2003/0128483 A1 | 7/2003 | Kamijo |
| 2003/0232223 A1 | 12/2003 | Leddy et al. |
| 2004/0042128 A1 | 3/2004 | Slaughter et al. |
| 2004/0130936 A1 | 7/2004 | Nguyen et al. |
| 2004/0159832 A1 | 8/2004 | Hack |
| 2004/0170055 A1 | 9/2004 | Albert et al. |
| 2004/0201070 A1 | 10/2004 | Deak |
| 2005/0045913 A1 | 3/2005 | Nguyen et al. |
| 2005/0063222 A1 | 3/2005 | Huai et al. |
| 2005/0105325 A1 | 5/2005 | Haneda et al. |
| 2005/0167657 A1 | 8/2005 | Nickel et al. |
| 2005/0185455 A1* | 8/2005 | Huai ..................... 365/171 |
| 2005/0195532 A1 | 9/2005 | Sugiyama et al. |
| 2005/0201020 A1 | 9/2005 | Fuke et al. |
| 2005/0207219 A1 | 9/2005 | Lee et al. |
| 2005/0254287 A1 | 11/2005 | Valet |
| 2006/0017081 A1 | 1/2006 | Sun et al. |
| 2006/0056114 A1* | 3/2006 | Fukumoto et al. ......... 360/324.2 |
| 2006/0081953 A1 | 4/2006 | Nguyen et al. |
| 2006/0083056 A1 | 4/2006 | Daughton et al. |
| 2006/0104110 A1 | 5/2006 | Sun et al. |
| 2006/0109591 A1 | 5/2006 | Ranjan et al. |
| 2006/0114620 A1 | 6/2006 | Sbiaa et al. |
| 2006/0141640 A1 | 6/2006 | Huai et al. |
| 2006/0171198 A1 | 8/2006 | Saito et al. |
| 2006/0187703 A1 | 8/2006 | Mizuguchi et al. |
| 2006/0192237 A1 | 8/2006 | Huai |
| 2006/0227465 A1 | 10/2006 | Inokuchi et al. |
| 2006/0239066 A1 | 10/2006 | Liaw |
| 2006/0268604 A1 | 11/2006 | Onogi et al. |
| 2007/0007609 A1 | 1/2007 | Saito et al. |
| 2007/0085068 A1 | 4/2007 | Apalkov et al. |
| 2007/0164336 A1 | 7/2007 | Saito et al. |
| 2007/0201265 A1 | 8/2007 | Ranjan |
| 2007/0253245 A1 | 11/2007 | Ranjan |
| 2008/0043519 A1 | 2/2008 | Kitagawa et al. |
| 2008/0094886 A1 | 4/2008 | Ranjan |
| 2008/0164548 A1 | 7/2008 | Ranjan |
| 2008/0191251 A1 | 8/2008 | Ranjan |
| 2008/0191295 A1 | 8/2008 | Ranjan |
| 2008/0225585 A1 | 9/2008 | Ranjan |
| 2008/0246104 A1 | 10/2008 | Ranjan |
| 2008/0293165 A1 | 11/2008 | Ranjan |
| 2009/0046501 A1 | 2/2009 | Ranjan |
| 2009/0109739 A1 | 4/2009 | Ranjan |

FOREIGN PATENT DOCUMENTS

| | | |
|---|---|---|
| JP | 2004006774 A | 1/2004 |
| JP | 2006157027 A | 6/2006 |
| JP | 2006269530 A | 10/2006 |
| JP | 2006277864 A | 10/2006 |
| JP | 2006295198 | 10/2006 |
| JP | 2007073971 | 3/2007 |
| JP | 2007096105 A | 4/2007 |
| JP | 2007142364 A | 6/2007 |

OTHER PUBLICATIONS

Yingfan, Xu et al.; In situ ordering of FePt thin films with face-centered-tetragonal 001 texture on Cr100AxRux underlayer at low substrate temperature; Applied Physics Letters, vol. 80, No. 18, May 6, 2002.

S. Mangin et al.; Current-induced magnetization reversal in nanopillars with perpendicular anisotropy; Nature Materials; Mar. 2005; vol. 5.

F. J. Albert, et al.; Quantitative Study of Magnetization Reversal by Spin-Polarized Current in Magnetic Multilayer Nanopillars; Physical Review Letters; vol. 89, No. 22; Nov. 25, 2002.

Hao Meng, et al.; Current Confined Effect of Magnet Nano-Current-Channel for Magnetic Random Access Memory; The Center for Micromagnetics and Information Technology; Oct. 31, 2006.

L. Berge; Emission of spin waves by a magnetic multilayer traversed by a current; Physical Review; Oct. 1, 1996; vol. 54, No. 13.

G. D. Fuchs, et al.; Spin Torque, Tunnel-Current Spin Polarization, and Magnetoresistance in MgO Magnetic Tunnel Junctions; Physical Review Letters; PRL 96, 186603 (2006); May 12, 2006.

Jun Hayakawa; Current-Driven Magnetization Switching in CoFeB/MgO/CoFeB Magnetic Tunnel Junctions; Japanese Journal of Applied Physics; vol. 44, No. 41, 2005, pp. L 1267-L 1270.

Hao Meng, et al.; Composite free layer for high density magnetic random access memory with lower spin transfer current; Applied Physics Letters 89, 152509; Oct. 12, 2006.

Hao Meng, et al.; Low critical current for spin transfer in magnetic tunnel junctions; Applied Physics Letters; 88; Feb. 23, 2006.

G. D. Fuchs; Spin-transfer effects in nanoscale magnetic tunnel junctions; Applied Physics Letters; vol. 85, No. 7; Aug. 16, 2004.

J.C. Slonezewski; Current-driven excitation of magnetic multi-layers; Journal of Magnetism and Magnetic Materials; Dec. 19, 1995.

G. Consolo, et al.; Spin-torque switching in Py/Cu/Py and Py/Cu/CoPt spin-valve nanopillars; Journal of Magnetism and Magnetic Materials; Mar. 23, 2007.

F. J. Albert; Spin-polarized current switching of a Co thin film nanomagnet; Applied Physics Letters; vol. 77, No. 23; Dec. 4, 2000.

Xiaochun Zhu; Spin Torque and Field-Driven Perpendicular MRAM Designs Scalable to Multi-Gb/Chip Capacity; , vol. 42, No. 10, Oct. 2006.

C. J. Sun, et al.; Epitaxial L1o FePt magnetic thin films sputtered on Cu (001); Applied Physics Letters; vol. 82, No. 12; Mar. 24, 2003.

J. A. Katine et al.; Current-Driven Magnetization Reversal and Spin-Wave Excitations in CoCuCo Pillars; Physical Review Letters; vol. 84; Apr. 3, 2000.

L. Berger, Emission of spin waves by a magnetic nultilayer traversed by a current, article, Oct. 1, 1996, 6 pages, vol. 54, No. 13, The American Physical Society.

F.J. Albert, J.A. Katine, R.A. Buhrman, and D.C. Ralph, Spin-polarized current switching of a Co thin film nanomagnet, article, Dec. 4, 2000, 3 pages, vol. 77-No. 23, American Institute of Physics.

B.N. Engel, J. Akerman, B. Butcher, R.W. Dave, M. Deherrera, M. Durlam, G. Grynkewich, J. Janesky, S.V. Pietambaram, N.D. Rizzo, J.M. Slaughter, K. Smith, J.J. Sun, and S. Tehrani, A 4-Mb Toggle MRAM Based on a Novel Bit and Switching Method, article, Jan. 2005, 5 pages, vol. 41-No. 1, IEEE Transactions on Magnetics.

J.C. Slonczewski, Letter to the Editor: Current-driven excitation of magnetic multilayers, journal, Dec. 19, 1995, 7 pages, Journal of Magnetism and Magnetic Materials 159.

Sossmeier, K.D. et al., Comparison between ac and dc current annealing in CoFeSiB glass-covered amorphouse microwires, J. Phys. D: Appl. Phys. 40 (2007) 3233-3238.

Nowosielski, R. et al., Crystallization kinetics of an amorphous Co77Si11.5B11.5 alloy, JAMME, Jul.-Aug. 2006. vol. 17, Issue 1-2, pp. 121-124.

Hiki, Y., et al., Stabilization of metallic glass by isochronal and isothermal annealing treatments, J. Phys.: Condens. Matter 19 (2007) 2005147 (7 pp).

Kubota, H., et al., Dependence of spin-transfer switching current on free layer thickness in Co-Fe-B/MgO/Co-Fe-B magnetic tunnel junctions, App. Phys. Letters 89, 032505 (2006) (3 pp.).

Tsunekawa, K., et al., Structural and Electrical Properties of (CoxFe100-x)81B19/Mg0/(CoxFe100-x)81B19 Magnetic Tunnel Junctions, HA-01 Intermag, May 12, 2006, 15 pp.

Munakata, M., et al., B-Concentration Dependence on Anisotropy Field of CoFeB Thin Film for Gigahertz Frequency Use, IEEE Transactions on Magnetics, vol. 41, No. 10, Oct. 2005, pp. 3262-3264.

Park, C., et al., Annealing effects on structural and transport properties of rf-sputtered CoFeB/MgO/CoFeB magnetic tunnel junctions, J. Applied Physics 99, 08A901 (2006), pp. 2639-2641.

Burton, J.D., et al., Atomic and Electronic Structure of the CoFeB/Mg0 Interface from First Principles, 3 pp.

Hayakawa, J., et al., Dependence of Giant Tunnel Magnetoresistance of Sputtered CoFeB/MgO/CoFeB Magnetic Tunnel Junctions on MgO Barrier Thickness and Annealing Temperature, 17 pp.

Ikeda, S., et al., Dependence of tunnel magnetoresistance on ferromagnetic electrode materials in MgO-barrier magnetic tunnel junctions, 9 pp.

Lee, Y. M., et al., Giant tunnel magnetoresistance and high annealing stability in CoFeB/MgO/CoFeB magnetic tunnel junctions with synthetic pinned layer, 17 pp.

Albert, F.J., et al., Spin-polarized current switching of a Co thin film nanomagnet, Applied Physics Letters, vol. 77, No. 23, Dec. 4, 2000, pp. 3809-3811.

Emley, N.C., et al., Reduction of spin transfer by synthetic antiferromagnets, Applied Physics Letters, vol. 84, No. 21, May 24, 2004, pp. 4257-4259.

Fuchs, G.D., et al., Spin-transfer effects in nanoscale magnetic tunnel junctions, Applied Physics Letters, vol. 85, No. 7, Aug. 16, 2004, pp. 1205-1207.

Fuchs, G.D., et al., Adjustable spin torque in magnetic tunnel junctions with two fixed layers, Applied Physics Letters, 86, 152509 (2005), 3 pp.

Braganca, P.M., et al., Reducing the critical current for short-pulse spin-transfer switching of nanomagnets, Applied Physics Letters 87, 112507 (2005), 3 pp.

Ozatay, O., et al., Spin transfer by nonuniform current injection into a nanomagnet, Applied Physics Letters 88, 202502 (2006), 3 pp.

Kiselev, S., et al., Spin-Transfer-Driven Magnetic Switching and Precession, Nanomagnetics Workshop, May 14, 2004, 25 pp.

Tinkham, M., et al., Tunneling Through Metallic Quantum Dots, J. of Low Temperature Physics, vol. 118, Nos. 5/6, 2000, pp. 271-285.

Krivorotov, I.N., et al., Large-amplitude coherent spin waves exited by spin-polarized current in nanoscale spin valves, 24 pp.

Pribiag, V.S., et al., Magnetic vortex oscillator driven by dc spin-polarized current, 14 pp.

Salinas, D.G., et al., Effects of spin-orbit interactions on tunneling via discrete energy levels in metal nanoparticles, Physical Review B, vol. 60, No. 8, Aug. 15, 1999, pp. 6137-6145.

Waintal, X., et al., Role of spin-dependent interface scattering in generating current-induced torques in magnetic multilayers, Physical Review B, vol. 62, No. 18, Nov. 1, 2000, pp. 12317-12327.

Kiselev, S. I., et al., Spin-transfer excitations of permalloy nanopillars for large applied currents, Physical Review B 72, 064430 (2005), 10 pp.

Katine, J.A., et al., Current-Driven Magnetization Reversal and Spin-Wave Excitations in Co/Cu/Co Pillars, Physical Review Letters, vol. 84., No. 14, Apr. 3, 2000, pp. 3149-3152.

Myers, E.B., et al., Thermally Activated Magnetic Reversal Induced by a Spin-Polarized Current, Physical Review Letters, vol. 89, No. 19, Nov. 4, 2002, 4 pp.

Albert, F.J., et al., Quantitative Study of Magnetization Reversal by Spin-Polarized Current in Magnetic Multilayer Nanopillars, Physical Review Letters, vol. 89, No. 22, Nov. 25, 2002, 4 pp.

Kiselev, S. I., et al., Current-Induced Nanomagnetic Dynamics for Magnetic Fields Perpendicular to the Sample Plane, Physical Review Letters, vol. 93, No. 3, Jul. 16, 2004, 4 pp.

Krivorotov, I.N., Temperature Dependence of Spin-Transfer-Induced Switching of Nanomagnets, Physical Review Letters, vol. 93. No. 16, Oct. 15, 2004, 4 pp.

Fuchs, G.D., et al., Spin Torque Tunnel-Current Spin Polarization and Magnetoresistance in MgO Magnetic Tunnel Junctions, Physical Review Letters 96, 186603, May 12, 2006, 4 pp.

Myers, E.B., Current-Induced Switching of Domains in Magnetic Multilayer Devices, Science, vol. 285, Aug. 6, 1999, pp. 867-870.

Krivorotov, I.N., Time-Domain Measurements of Nanomagnet Dynamics Driven by Spin-Transfer Torques, Science, vol. 307, Jan. 14, 2005.

Myers, E.B., Currrent-lnduced Switching of Domains in Magnetic Multilayer Devices, 14 pp.

Shibata, J., et al., Magnetic Vortex Dynamics Induced by Spin-Transfer Torque, 1 p.

Klaui, M., et al., Direct Observation of Domain-Wall Configurations Transformed by Spin Currents, Physical Review Letters 95, 026601 Jul. 8, 2005, 4 pp.

Thomas, L., et al., Oscillatory dependence of current-driven magnetic domain wall motion on current pulse length, Nature, vol. 443/14, Sep. 2006, pp. 197-200.

Saitoh, E., et al., Current-induced resonance and mass determination of a single magnetic domain wall, Nature, vol. 431, Nov. 11, 2004, pp. 203-206.

Jung, S-W, et al., Current-Induced Magnetic Domain-Wall Motion by Spin Transfer Torque: Collective Coordinate Approach with Domain-Wall Width Variation, 13 pp.

Vanhaverbeke, A., et al., Transverse domain wall propagated by spin-polarized current, IBM Research, Zurich Research Laboratory, 1 p.

Bazaliy, Y.B., et al., Nonlinear regimes of current-induced domain wall motion, 29 pp.

Waintal, X., et al., Current induced distortion of a magnetic domain wall, May 9, 2007, 5 pp.

Laufenberg, M., Dissertation, Interactions Between Current and Domain Wall Spin Structures, Jul. 26, 2006, 210 pp.

Vernier, N., et al., Domain wall propagation in magnetic nanowires by spin polarized current injection, 17 pp.

Beach, G.S.D., et al., Dynamics of field-driven domain-wall propagation in ferromagnetic nanowires, Nature Materials 4, 741-744 (2005).

Varga, E., Domain wall motion in permalloy wires, 12 pp.

Lua, S.Y.H., et al., Effect of an exchange tab on the magnetization switching process of magnetic nanowires, J. Phys. D: Appl. Phys 40 (2007) 3011-3015.

Ohno, H., et al., Electrical Manipulation of Domain Walls in Ferromagnetic Semiconductors, Croucher Advanced Study Institute—Science and Applications of Spin Electronics, The University of Hong Kong, Aug. 15-20, 2005, 23 pp.

Stiles, M.D., et al., Adiabatic Domain Wall Motion and Landau-Lifshitz Damping, May 31, 2007. 6 pp.

Jubert, P.O., Structure and current-induced motion of magnetic domain walls, 4 pp.

Berakdar, J., et al., Spin transport and spin torque in a magnetic nanowire with a non-collinear magnetic order, J. Physics: Conference Series 61 (2007) 105-109.

Tsoi, M., et al, Magnetic domain wall motion triggered by an electric current, App. Phys. Letters, vol. 83, No. 13, Sep. 29, 2003, 2617-2619.

Thiaville, A., et al., Micromagnetic understanding of current-driven domain wall motion in patterned nanowires, Europhys. Lett 69 (6), Mar. 15, 2005, pp. 990-996.

Shibata, J., et al., Current-induced magnetic vortex motion by spin-transfer torque, Physical Review B 73, 020403(R) (2006), 4 pp.

Yamaguchi, A., et al., Reduction of threshold current density for current-driven domain wall motion by shape control, 16 pp.

Kimura, T., et al., Spin-current-assisted domain-wall depinning in a submicron magnetic wire, J. App. Phys., vol. 94, No. 12, Dec. 15, 2003, pp. 7947-7949.

Grollier, J., et al., Switching a spin-valve back and forth by current-induced domain wall motion, 4 pp.

Grollier, J., et al., Switching the magnetic configuration of a spin valve by current-induced domain wall motion, J. App. Phys., vol. 92, No. 8, Oct. 15, 2002, pp. 4825-4827.

Gomez, R.D., et al., An approach to Wearable Magnetic Random Access Memory, ECE Dept., University of Maryland, 12 pp.

Hajto, J., et al., Quantized Electron Transport in Amorphous-Silicon Memory Structures, Physical Review Letters, vol. 66, No. 14, Apr. 8, 1991, pp. 1918-1921.

Rossel, C., et al., Electrical current distribution across a metal-insulator-metal structure during bistable switching, J. Appl. Phys., vol. 90, No. 6, Sep. 15, 2001, pp. 2892-2898.

DeBrosse, J., Circuit Considerations for Spin-Switched MRAM Devices, IBM Microelectronics, May 14, 2004, 15 pp.

Maffitt, T.M., et al., Design considerations for MRAM, IBM J. Res. & Devl., vol. 50, No. 1, Jan. 2006, pp. 25-39.

Gallagher, W. J. et al., Development of the magnetic tunnel junction MRAM at IBM: From first junctions to a 16-Mb MRAM demonstrator chip, IBM J. Res. & Devl., vol. 50, No. 1, Jan. 2006, pp. 5-23A.

Jiang, X., et al., Highly efficient room-temperature tunnel spin injector using CoFe/MgO(001), IBM J. Res. & Dev., vol. 50, No. 1, Jan. 2006, pp. 111-120.

Parkin, Stuart, Magnetic Race-Track Memory: Current Induced Domain Wall Motion, IBM Research, 2006, 60 pp.

Abraham, D.W., Rapid-turnaround characterization methods for MRAM development, IBM J. Res. & Dev., vol. 50, No. 1, Jan. 2006, pp. 55-67.

Worledge, D.C., Single-domain model for toggle MRAM, IBM J. Res. & Dev., vol. 50, No. 1, Jan. 2006, , pp. 69-79.

Sun, J.Z., Spin angular momentum transfer in current-prpendicular nanomagnetic junctions, IBM J. Res. & Dev., vol. 50, No. 1, Jan. 2006, pp. 81-100.

Wolf, S.A., Spintronics—A retrospective and perspective, IBM J. Res. & Dev., vol. 50, No. 1, Jan. 2006, pp. 101-110.

Gaidis, M.C., Two-level BEOL processing for rapid iteration in MRAM development, IBM J. Res. & Dev., vol. 50, No. 1, Jan. 2006, pp. 41-54.

Ikeda, S., Magnetic Tunnel Junctions for Spintronic Memories and Beyond, IEEE Trans. on Electron Devices, vol. 54., No. 5, May 2007, pp. 991-1002.

Johnson, M., Optimized Device Characteristics of Lateral Spin Valves, IEEE Trans. on Electron Devices, vol. 54., No. 5, May 2007, pp. 1024-1031.

Tanaka, M., et al., MOS-Based Spin Devices for Reconfigurable Logic, IEEE Trans. on Electron Devices, vol. 54., No. 5, May 2007, pp. 961-976.

Bibes M., et al., Oxide Spintronics, IEEE Trans. on Electron Devices, vol. 54., No. 5, May 2007, pp. 1003-1023.

Van Roy, W., et al., Spin Injection and Detection in Semiconductors—Electrical Issues and Device Aspects, IEEE Trans. on Electron Devices, vol. 54., No. 5, May 2007, pp. 933-944.

Sanchez, David, et al., Spin-Polarized Transport in II-VI Magnetic Resonant-Tunneling Devices, IEEE Trans. on Electron Devices, vol. 54., No. 5, May 2007, pp. 984-990.

Nitta, J. et al., Electrical Manipulation of Spin Precession in an InGaAs-Based 2DEG Due to the Rashba Spin-Orbit Interaction, IEEE Trans. on Electron Devices, vol. 54., No. 5, May 2007, pp. 955-960.

Flatte, M.E., Spintronics, IEEE Trans. on Electron Devices, vol. 54., No. 5, May 2007, pp. 907-920.

Gould, C. et al., Tunneling Anisotropic Magnetoresistance-Based Devices, IEEE Trans. on Electron Devices, vol. 54., No. 5, May 2007, pp. 977-983.

Pearton, S.J., et al., ZnO Doped With Transition Metal Ions, IEEE Trans. on Electron Devices, vol. 54., No. 5, May 2007, pp. 1040-1048.

Seneor, P. et al., Nanospintronics: when spintronics meets single electron physics, J. Phys: Condens. Matter 19 (2007) 22 pp.

Ernult, F. et al., Spin accumulation in metallic nanoparticles, J. Phys: Condens. Matter 19 (2007) 19 pp.

Dieny, B. et al., Spin Electronics, J. Phys: Condens. Matter 19 (2007) 3 pp.

Kimura, T. et al., Spin transport in lateral ferromagnetic/nonmagnetic hybrid structures, J. Phys: Condens. Matter 19 (2007) 13 pp.

Tiusan, C. et al., Spin tunnelling phenomena in single-crystal magnetic tunnel junction systems, J. Phys: Condens. Matter 19 (2007) 35 pp.

Diao, Z. et al., Spin-transfer torque switching in magnetic tunnel junctions and spin-transfer torque random access memory, J. Phys: Condens. Matter 19 (2007) 13 pp.

Attema, J.J., et al, Spintronic materials based on main-group elements, J. Phys: Condens. Matter 19 (2007) 11 pp.

Moodera, J.S. et al., The phenomena of spin-filter tunnelling, J. Phys: Condens. Matter 19 (2007) 24 pp.

Ding, Y. et al., Fabrication of current-induced magnetization switching devices using etch-back planarization process, J. Appl. Phys. 97 (2005) 3 pp.

Meng, H. et al., Low resistance spin-dependent magnetic tunnel junction nwith high breakdown voltage for current-induced magnetization-switching devices, J. Appl. Phys. 97 (2005) 3 pp.

Meng, H., Spin Transfer with Low Switching Current Density, University of Minnesota, 2006 MINT Review, 14 pp.

Meng, H. et al., Spin Transfer Effect in Magnetic Tunnel Junction with Nano-Current-Channel, University of Minnesota, InterMag 2005, 14 pp.

Meng, H. et al., Composite free layer for high density magnetic random access memory with lower spin transfer current, Appl. Phys. Letters 89 (2006) 3 pp.

Meng, H. et al., Spin transfer in nanomagnetic devices with perpendicular anisotropy, Appl. Phys. Letters 88 (2006) 3 pp.

Meng, H. et al., A Composite Free Layer for High Density Magnetic Random Access Memory with Lower Spin Transfer Current, Submitted to Appl. Phys. Letters, May 2006, 14 pp.

Meng, H. et al., Spin Transfer Effect in Magnetic Tunnel Junction With a Nano-Current-Channel Layer in Free Layer, IEEE Trans. on Magnetics, vol. 41, No. 10, Oct. 2005, pp. 2612-2614.

Meng, H. et al., Spin Transfer Effect in Magnetic Tunnel Junction with Low Resistance, The Center for Micromagnetic and Information Technology (MINT) & Department of Electrical & Computer Engineering, University of Minnesota, 2 pp.

Meng, H. et al., A New Memory Cell Structure for MRAM with Low Writing Threshold, MMM 2005, University of Minnesota, 13 pp.

Meng, H. et al., Spin Transfer in Magnetic Nano Devices with Perpendicular Anisotropy, MMM 2005, University of Minnesota, 13 pp.

Meng, H. et al., Low critical current for spin transfer in magnetic tunnel junctions, Appl. Phys. Letters 88 (2006) 3 pp.

Meng, H. et al., A New Memory Cell Structure for Magnetic Random Access Memory with Low Writing Threshold, The Center for Micromagnetic and Information Technology (MINT) & Department of Electrical & Computer Engineering, University of Minnesota, 1 p.

Wang, J.-P. et al., Spin Transfer in Magnetic Nano Devices with Perpendicular Anisotropy, University of Minnesota, 2006 APA A-22. 00011, 14 pp.

Lo, T.N. et al., E-beam lithography and electrodeposition fabrication of thick nanostructured devices, J. Phys. D: Appl. Phys 40 (2007) pp. 3172-3176.

Technology Backgrounder: Immersion Lithography, IC Knowledge 2003, 5 pp.
Martin, J.I. et al., Ordered magnetic nanostructures: fabrication and properties, J. Magnetism and Magnetic Materials 256 (2003) pp. 449-501.
Onai, T. et al., Outlook for Advanced Semiconductor Process and Manufacturing Technologies, Hitachi Review, vol. 52 (2003) No. 3, pp. 117-124.
Garner, C.M., Technology Challenges & Opportunities for Nanomaterials, 2007 ITRS Public Conference, 15 pp.
Chezan, A.R. et al., Influence of stresses and magnetostriction on the soft magnetic behavior of metallic films, J. Magnetism and Magnetic Materials 299 (2006) pp. 219-224.
Wang, D. et al., Magnetostriction Effect of Amorphous CoFeB Thin Films and Application in Spin Dependent Tunnel Junctions, NVE Corporation, 2004, pp. 1-14.
Shin, C.-S. et al., Growth, surface morphology, and electrical resistivity of fully strained substoichiometric epitaxial TiNx ($0.67<\_x<1.0$) layers on MgO(001), J. Appl. Phys., vol. 95, No. 1, Jan. 1, 2004, pp. 356-362.
Itoh, H., Theory of tunnel magnetoresistance and spin filter effect in magnetic tunnel junctions, J. Phys. D: Appl. Phys. 40 (2007) 1228-1233.
Liu, X. et al., Thermal stability of magnetic tunneling junctions with MgO barriers for high temperature spintronics, Appl. Phys. Lett. 89, 023504 (2006) 3 pp.
Trachenko, K. et al., How the nature of the chemical bond governs resistance to amorphization by radiation damage, Physical Review B 71, 184104 (2005) 5 pp.
Shen, W. et al., Effect of film roughness in MgO-based magnetic tunnel junctions, Appl. Phys. Lett. 88, 182508 (2006) 3 pp.
Ikeda, S. et al., Dependence of tunnel magnetoresistance in MgO based magnetic tunnel junctions on Ar pressure during MgO sputtering, 19 pp.
Miao, G-X. et al., Inelastic tunneling spectroscopy of magnetic tunnel junctions based on CoFeB/MgO/CoFeB with Mg insertion layer, J. Appl. Phys. 99, 08T305 (2006) 3 pp.
Diao, Z. et al., Spin transfer switching in dual MgO magnetic tunnel junctions, Appl. Phys. Lett. 90, 132508 (2007) 3 pp.
Padhan, P. et al., Frequency-dependent magnetoresistance and magnetocapacitance properties of magnetic tunnel junctions with MgO tunnel barrier, Appl. Phys. Lett. 90, 142105 (2007) 3 pp.
Lee, J.M. et al., Current-Induced Magnetization Switching Probability in MgO-Based Magnetic Tunnel Junctions, IEEE Transactions on Magnetics, vol. 43, No. 2, Feb. 2007, pp. 917-919.
Kawahara, T. et al., 2Mb Spin-Transfer Torque RAM (SPRAM) with Bit-by-Bit Bidirectional Current Write and Parallelizing-Direction Current Read, ISSCC 2007, Session 26, Non-Volatile Memories, 26.5, pp. 480-481.
Lee, Y.M. et al., Giant tunnel magnetoresistance and high annealing stability in CoFeB/MgO/CoFeB magnetic tunnel junctions with synthetic pinned inned layer, pp. 1-17.
Dave, R.W. et al., MgO-Based Tunnel Junction Material for High-Speed Toggle Magnetic Random Access Memory, IEEE Transactions on Magnetics, vol. 42, No. 8, Aug. 2006, pp. 1935-1939.
Lee, K.J., Excitations of Incoherent Spin-Waves due to Spin-Tranfer Torque, pp. 1-14.
Kiselev, S.I. et al., Current-Induced Nanomagnetic Dynamics for Magnetic Fields Perpendicular to the Sample Plane, Phys. Rev. Lett., vol. 93, No. 3, Jul. 16, 2004, 4 pp.
Sankey, J.C. et al., Mechanisms limiting the coherence time of spontaneous magnetic oscillations driven by dc spin-polarized currents, Physical Review B 72, 224227 (2005) 5 pp.
Nogi, Y. et al., Preparation and magnetotransport properties of MgO-barrier-based magnetic double tunnel junctions including nonmagnetic nanoparticles, J. Phys. D: Appl. Phys. 40 )2007) pp. 1242-1246.
Barnetson, D., QDMtm Flash Memory, Semicon West 2007, Jul. 17, 2007, 18 pp.
Ernult, F. et al., Spin accumulation in metallic nanoparticles, J. Phys.: Condens. Matter 19 (2007) 165214, 19 pp.
Hayakawa, J. et al., Current-driven switching of exchange biased spin-valve giant magnetoresistive nanopillars using a conducting nanoprobe, J. Appl. Phys., vol. 96, No. 6, Sep. 15, 2004, pp. 3440-3442.
Rippard, W.H. et a., Quantitative studies of spin-momentum-transfer-induced excitations in Co/Cu multilayer films using point-contact spectroscopy, Appl. Phys. Lett., vol. 82, No. 8, Feb. 24, 2003, pp. 1260-1262.
Chen, T.Y. et al., Current-incdued switching in a single exchange-biased ferromagnetic layer, J. Appl. Phys. 97, 10C709 (2005) 3 pp.
Chen, T.Y. et al., Enhanced Magnetoresistance Induced by Spin Transfer Torque in Granular Films with a Magnetic Field, PRL 96, 207203 (2006) 4 pp.
Chen, T. et al., Oxygen-pressure dependence of the crystallinity of MgO films grown on Si(1 0 0) by PLD, Journal of Crystal Growth 270 (20040, pp. 553-559.
Xiao, J. et al., Macrospin models of spin transfer dynamics, Phys. Rev. B 72, 014446 (2005), 13 pp.
Stiles, M.D. et al., Phenomenological Theory of Current-Induced Magnetization Precession, Nov. 20, 2003, 16 pp.
Stiles, M.D. et al., Spin Transfer Torque and Dynamics, 85 pp.
Rippard, W.H. et al., Spin-Transfer Induced Dynamics in Magnetic Nanostructures, NIST nanomagntodynamics and DARPA SpinS program, 29 pp.
Xiao, J. et al., Spin-transfer torque for continuously variable magnetization, Phys. Rev. B 73, 054428 (2006) 10 pp.
Derbenwick, G.F. et al., Advances in FeRAM Technologies, Celis Semiconductor Corporation, 3 pp.
Liu, S. et al., A New Concept for Non-Volatile Memory: The Electric-Pulse Induced Resistive Change Effect in Colossal Magnetoresistive Thin Films, Non-Volatile Memory Conference, San Diego, CA, Nov. 6-7, 2001, 32 pp.
Liu, S.Q. et al., A New Concept for Non-Volatile Memory: The Electric-Pulse Induced Resistive Change Effect in Colossal Magnetoresistive Thin Films, Space Vacuum Epitaxy Center, 7 pp.
Dippert, B., Hitting their stride: Nonvolatile-memory upstarts draw near to established leaders, designfeature: Advanced nonvolatile memories, Jan. 20, 2005, EDN 55, 6 pp.
Lupo, D.W., Thin Film Electronics ASA, ThinFilm Presentation, May 9, 2007, Thin Film Electronics, 33 pp.
Derbenwick, G.F. et al., Advances in FeRAM Technology, Non Volatile Memory Technology Symposium, Nov. 15-16, 2000, Arlington, VA, 23 pp.
Lenssen, J.-M.H. et al., Expectations of MRAM in comparison with other non-volatile memory technologies, 6 pp.
Maimon, J. et al., Chalcogenide-Based Non-Volatile Memory Technology, Mission Research Corporation, 18 p.
Deak, J.G., Spin Injection in Thermally Assisted Magnetic Random Access Memory, NVE Corporation, 15 pp.
Anderson, J.M. et al., Address line-assisted switching of vertical magnetoresistive random access memory (VMRAM) cells, 49th Conference on Magnetism and Magnetic Materials, 15 pp.
Daughton, J., Magnetic Spin Devices: 7 Years from Lab to Product, Symposium X, MRS 2004 Fall Meeting, Dec. 1, 2004, 27 pp.
Tondra, M. et al., High Temperature Pinning Properties of IrMn vs. FeMn in Spin Valves, J. Vacuum Science and Technology, Jul./Aug. 1999, 15 pp.
Deak, J., Thermal Magnetic Random Access Memory, IEEE International Conference on Computer Design, New Memory Technologies, Oct. 4, 2005, 38 pp.
Deak, J. et al., Effect of Resistance-Area-Product and Thermal Environment on Writing of Magneto-Thermal MRAM, Mar. 13, 2006, 3 pp.
Daughton, J., Spintronic Applications at NVE, Cornell University, May 14, 2004, 39 pp.
Wang, D. et al., Spin dependent tunneling junctions with reduced Neel coupling, J. Appl. Phys., vol. 93, No. 10, Parts 2 & 3, May 15, 2003, pp. 8558-8560.
Sinclair, A. et al., Scaling and Power Properties of Thermally Written MRAM, Abstract, NVE Corporation, 1 p.
Carson, J.C. et al., High Density Packaging of Non-Volatile Memory, Irvine Sensors Corporation, 3 pp.

Diao, Z. et al., Spin-transfer torque switching in magnetic tunnel junctions and spin-transfer torque random access memory, J. Phys. Condens. Matter 19 (2007) 165209, 13 pp.

Manchon, A. et al., Modelling spin transfer torque and magnetoresistance in magnetic multilayers, J. Phys. Condens. Matter 19 (2007) 165212, 42 pp.

Tiusan, C. et al., Spin tunnelling phenomena in single-crystal magnetic tunnel junction systems, J. Phys. Condens. Matter 19 (2007) 165201, 35 pp.

Ochiai, T. et al., Distinctive current-induced magnetization switching in a current-perpendicular-to-plane giantmagnetoresistance nanopillar with a synthetic antiferromagnet free layer, Appl. Phys. Lett 86, 242506 (2005), 3 pp.

Berger, L., Multilayer configuration for experiments of spin precession induced by a dc current, J. Appl. Phys., vol. 93, No. 10, Parts 2 & 3, May 15, 2003, pp. 7693-7695.

Jiang, Y. et al., Substantial reduction of critical current for magnetization switching in an exchange-biased spin valve, Nature Materials, vol. 3, Jun. 2004, pp. 361-364.

Slonczewski, J.C., Conductance and exchange coupling of two ferromagnets separated by a tunneling barrier, Phys. Rev. B, vol. 39, No. 10, Apr. 1, 1989, pp. 6995-7002.

Slonczewski, J.C., Currents, torques, and polarization factors in magnetic tunnel junctions, Phys. Rev. B 71, 024411 (2005), 10 pp.

Mao, S. et al., Commercial TMR Heads for Hard Disk Drives: Characterization and Extendibility At 300 Gbit/in2, IEEE Transactions on Magnetics, vol. 42, No. 2, Feb. 2006, pp. 97-102.

Coyne, J., Storage Market: Opportunities, Myths and Facts, Western Digital, May 17, 2007, 24 pp.

Shimazawa, K. et al., Enhanced GMR Ratio of Dual Spin Valve With Monolayer Pinned Structure, IEEE Transactions on Magnetics, vol. 42, No. 2, Feb. 2006, pp. 120-125.

Wurz, M.C. et al., Fabrication of a Micro Coil for Magnetooptical Data Storage, IEEE Transactions on Magnetics, vol. 42, No. 10, Oct. 2006, pp. 2468-2470.

Rottmayer, R.E. et al., Heat-Assisted Magnetic Recording, IEEE Transactions on Magnetics, vol. 42, No. 10, Oct. 2006, pp. 2417-2421.

Covington, M., Spin transfer and other challenges in data storage, Seagate Research, Pittsburgh, PA, 27 pp.

Kumar, S.B. et al., MR Enhancement in a Current Perpendicular-to-Plane Spin Valve by Insertion of a Ferromagnetic Layer Within the Space Layer, IEEE Transactions on Magnetics, vol. 42, No. 10, Oct. 2006, pp. 2459-2461.

Wong, R-K. et al., Reliability of Tunneling Magnetoresistance Recording Head—Lifetime, Failure Mode, and Production Screening, IEEE Transactions on Magnetics, vol. 42, No. 2, Feb. 2006, pp. 232-236.

White, R.M. et al., Spin Transfer Stimulated Noise in Magnetic Recording Heads, Data Storage Systems Center, 41 pp.

Park, C. et al., Annealing effects on structural and transport properties of rf-sputtered CoFeB/MgO/CoFeB magnetic tunnel junctions, J. Appl. Phys. 99, 08A901 (2006), 3 pp.

Wiese, N. et al., Antiferromagnetically coupled CoFeB/Ru/CoFeB trilayers, arXiv:cond-mat10509749v1, Sep. 28, 2005, 3 pp.

Peng, Y. et al., Characterization of interfacial reactions in magnetite tunnel junctions with transmission electron microscopy, J. Appl. Phys., vol. 95, No. 11, pp. Jun. 1, 2004, 6798-6800.

Svedberg, E.B., Diffusion in Co90Fe10/Ru multilayers, J. Appl. Phys., vol. 94, No. 2, Jul. 15, 2003, pp. 993-1000.

Park, C. et al., Effect of Adjacent Layers on Crystallization and Magnetoresistance in CoFeB/MgO/CoFeB Magnetic Tunnel Junction, IEEE Transactions on Magnetics, vol. 42, No. 10, Oct. 2006, pp. 2639-2641.

Roy, A.G. et al., Effect of seed layers in improving the crystallographic texture of CoCrPt perpendicular recording media, J. Appl. Phys., vol. 91, No. 10, May 15, 2002, pp. 8076-8078.

Perdue, K.L. et al., Exchange Bias and Giant Magnetoresistance in Spin Valves with Angstrom-Scale Antiferromagnetic Layers at 5 K, Harvey Mudd College, Apr. 29, 2005, 40 pp.

Svedberg, E.B. et al., Interdiffusion in CoFe/Cu multilayers and its application to spin-valve structures for data storage, J. Appl. Phys., vol. 94, No. 2, Jul. 15, 2003, pp. 1001-1006.

Park, C. et al., Interfacial Composition and Microstructure of Fe3O4 Magnetic Tunnel Junctions, IEEE Transactions on Magnetics, vol. 39, No. 5, Sep. 2003, pp. 2806-2808.

Kim, Y.K. et al., Investigation of Magnetoresistive Characteristics of Metallic Multilayers Comprising Ru-Based Synthetic Antiferromagnetic Layers, J. Korean Phys. Soc., vol. 43, No. 3, Sep. 2003, pp. 396-399.

Moyerman, S. et al., Magnetic structure variations during giant magnetoresistance training in spin valves with picoscale antiferromagnetic layers, J. Appl. Phys. 99, 08R505 (2006), 3 pp.

Lu, B. et al., The Physics of Ultrahigh-Density Magnetic Recording (Springer Series in Surface Sciences, 41), Chapter 2, Microstructure of Longitudinal Media, 38 pp.

Li, H.F.- F et al., Nanocrystallisation of an Fe44.5Co44.4Zr7B4 amorphous magnetic alloy, Philosophical Magazine, vol. 86, No. 10, Apr. 1, 2006, pp. 1355-1372.

Jeong, S. et al., Nanostructure and magnetic properties of polycrystalline FePdPt/MgO thin films, J. Appl. Phys., vol. 91, No. 10. May 15, 2002, pp. 8813-8815.

Hsu, Y.-N. et al, New Ni5Al3 Underlayer for Longitudinal Magnetic Recording Media, IEEE Transactions on Magnetics, vol. 38, No. 4, Jul. 2002, pp. 1803-1806.

Wierman, K.W. et al., RuxCr1-x/Ta underlayer for Co-alloy perpendicular magnetic recording, J. Appl. Phys., vol. 91, No. 10, May 15 2002, pp. 8031-8033.

Lee, J.C. et al., Stability enhancement of nanopillar structure for spin transfer magnetization switching using IrMn buffer layer, J. Appl. Phys. 99, 08G517 (2006), 3 pp.

Hsiao, A. et al., The Thermal, Magnetic, and Structural Characterization of the Crystallization Kinetics of Fe88Z47B4Cu1, An Amorphous Soft Magnetic Ribbon, IEEE Transactions on Magnetics, vol. 38, No. 5, Sep. 2002, pp. 3039-3044.

Stohr, J. et al., Magnetization Manipulation in Nanostructures by Spin Currents, NSF, Div. of Condensed Matter Physics & U.S. Dept. of Energy, 14 pp.

Kong, J.H. et al, Magnetization Reversal of Co\Cu\Co Pillars by Spin-Polarized Current with Magnetic Fields, J. Korean Phys. Soc., vol. 46, No. 4, Apr. 2005, pp. 931-936.

Berger, L., Emission of spin waves by a magnetic multilayer traversed by a current, Phys. Rev. B, vol. 54, No. 13, Oct. 1, 1996, pp. 9353-9358.

Slonczewski, J.C., Current-driven excitation of magnetic multilayers, Journal of Magnetism and Magnetic Materials 159 (1996), pp. L1-L7.

Albert, F.J. et al., Spin-polarized current switching of a Co thin film nanomagnet, Appl. Phys. Lett., vol. 77, No. 23, Dec. 4, 2000, pp. 3809-3811.

Berger, L., Multilayer configuration for experiments of spin precession induced by a dc current, J. Appl. Phys., vol. 93, No. 10, May 15, 2003, pp. 7693-7695.

Huai, Y. et al., Observation of spin-transfer switching in deep submicron-sized and low-resistance magnetic tunnel junctions, Appl. Phys. Lett., vol. 84, No. 16, Apr. 19, 2004, pp. 3118-3120.

Fuchs, G.D. et al., Adjustable spin torque n magnetic tunnel junctions with two fixed layers, Appl. Phys. Lett. 86, 152509 (2005), 3 pp.

Huai, Y. et al., Spin transfer switching current reduction in magnetic tunnel junction based dual spin filter structures, Appl. Phys. Lett. 87, 222510 (2005), 3 pp.

Hayakawa, J. et al., Current-Driven Magnetization Switching in CoFeB/MgO/CoFeB Magnetic Tunnel Junctions, JJAP, vol. 44, No. 41, 2005, pp. L1267-L1270.

Kalitsov, A. et al., Spin-polarized current-induced torque in magnetic tunnel junctions, J. Appl. Phys. 99, 08G501 (2006), 3 pp.

Vedyayev, A. et al., Resonant spin-torque in double barrier magnetic tunnel junctions, Physics Letters A 355 (2006), pp. 243-246.

Manchon, A. Modelling spin transfer torque and magnetoresistance in magnetic multilayers, J. Phys: Condens. Matter 19 (2007) 165212, 42 pp.

Mangin, S. et al., Current-induced magnetization reversal in nanopillars with perpendicular anisotropy, Nature Materials, vol. 5, Mar. 2006, pp. 210-215.

Wetzels, W. Interaction effects in spin-valve structures, Casimir PhD Series, Delft-Leiden, Mar. 2007, 117 pp.

Stiles, M.D. et al., Phenomenological Theory of Current-Induced Magnetization Precession, 16 pp., Nov. 2003.

Jeong, W.C. et al., Field assisted spin switching in magnetic random access memory, Samsung Electronics Co., Ltd., 14 pp.

Boulle, O. et al., Shaped Angular dependence of the spin transfer torque and microwave generation without magnetic field, 17 pp.

Wei, Z. et al., Spin transfer in an antiferromagnet, 5 pp.

Rivkin, K. et al., Switching spin valves using r.f. currents, 15 pp.

Yang, T. et al., Influence of capping layer on the current-induced magnetization switching in magnetic nanopillars, J. Appl Phys. 99, 073708 (2006), 5 pp.

Ji, Y. et al., Current-induced spin-wave excitations in a single ferromagnetic layer, 4 pp.

Nozieres, J.P., Magnetic Random Access Memories (M-RAM): A truly universal memory?, SPINTEC, 8 pp.

Dieny, B., Spintronics, Hong Kong Critical Components Manufacturing Inustry Quarterly Journal (Jun. 2002), 4 pp.

Dieny, B., Spin-Valves, 104 pp.

Karabacak, T. et al., Enhanced Step Coverage of Thin Films on Patterned Substrates by Oblique Angle Physical Vapor Deposition, May 22, 2004, 21 pp.

Yoda, H. et al., 1.8 V Power Supply 16 Mb-MRAMs With 42.3% Array Efficiency, IEEE Transactions on Magnetics, vol. 42, No. 10, Oct. 2006, pp. 2724-2726.

Engel, B.N. et al., A 4-Mb Toggle MRAM Based on a Novel Bit and Switching Method, IEEE Transactions on Magnetics, vol. 41, No. 1, Jan. 2005, pp. 132-136.

Tsuji, K. et al., 0.1 um-rule MRAM Development using Double-Layered Hard Mask, IEEE, IEDM 01-799-802.

Dittrich, R. et al., Energy barriers in magnetic random access memory elements, IEEE, 3 pp.

Slaughter, J. et al., MRAM Technology: Status and Future Challenges, Cornell CNS Nanotechnology Symposium, May 14, 2004, 45 pp.

Dave, Renu W., et al., MgO-Based Tunnel Junction Material for High-Speed Toggle Magnetic Random Access Memory, IEEE Transactions on Magnetics, vol. 42, No. 8, Aug. 2006. pp. 1935-1939.

Ju, K. et al., Multibit Cells Schemes for Toggle MRAM Applications, IEEE Transactions on Magnetics, vol. 42, No. 10, Oct. 2006, pp. 2730-2732.

Tehrani, S., Magnetoresistive RAM, Freescale Semiconductor, Jul. 17, 2007, 27 pp.

Boeve, H. et al., Technology assessment for the implementation of magnetoresistive elements with semiconductor components in magnetic random access memory (MRAM) architecture, IEEE Transactions on Magnetics, vol. 35, No. 5, Sep. 1999, pp. 2820-2825.

Schrefl, T. et al., Micromagnetic Simulations and Applications, Vienna University of Technology, 5 pp.

Kasai, S. et al., Current-driven resonant excitation of magnetic vortex, 16 pp.

Pribiag, V.S. et al., Magnetic vortex oscillator driven by dc spin-polarized current, Cornell University, 14 pp.

Acremann, Y. et al., Time Resolved Imaging of Spin Transfer Switching: Beyond the Macro-Spin Concept, PRL 96, 217202 (2006), 4 pp.

Ohldag, H. et al., Interfacial Moments in Co/NiO Origins of Antiferromagnetic/Ferromagnetic Coupling, 1 large page.

Ultrafast Magnetic Switching of Nanoelements with Spin Currents, Spin Injection, 8 pp.

Stohr, J., Probing the Ultrafast Magnetic Nanoworld with X-Rays, Stanford Synchrotron Radiation Laboratory, Stanford University, 43 pp.

Stohr, J., Soft X-Ray Science—From Photon Drought to Free Electron Lasers, Stanford Synchrotron Radiation Laboratory, 30 pp.

Stohr, J., The Magic of Magnetism: From Physical Attraction to Spin Doctors, Stanford Synchrotron Radiation Laboratory, Stanford Linear Accelerator Center, 45 pp.

Urban, R. et al., Gilbert Damping in Single and Multilayer Ultrathin Films: Role of Interfaces in Nonlocal Spin Dynamics, PRB, vol. 87, No. 21, 4 pp.

Fuchs, G.D. et al., Adjustable spin torque in magnetic tunnel junctions with two fixed layers, Appl. Phys. Lett. 86, 152509 (2005), 3 pp.

Petukhov, A.G. et al., 100% spin accumulation in non-half-metallic ferromagnet-semiconductor junctions, J. Phys.: Condens. Matter 19 (2007) 315205, 16 pp.

Bowen, M. et al., Using half-metallic manganite interfaces to reveal insights into spintronics, J. Phys: Condens. Matter 19 (2007) 315208, 27 pp.

Galanakis, I. et al., Spin-polarization and electronic properties of half-metallic Heusler alloys calculated from first principles, J. Phys., Condens. Matter 19 (2007) 315213, 16 pp.

Chen, T.Y. et al., Current-Driven Switching in a Single Exchange-Biased Ferromagnetic Layer, 3 pp.

Isogami, S. et al., Current-Induced Magnetization Switching and CPP-GMR in 30 nm o/ Scale Spin Valves Fabricated Using EB-Assisted CVD Hard Masks, IEEE Transactions on Magnetics, vol. 42, No. 10, Oct. 2006, pp. 2676-2678.

Chen, T.Y. et al., Current-Driven Switching in a Single Exchange-Biased Ferromagnetic Layer, J. Appl. Phys. 97, 10C709 (2005) 3 pp.

Craig, B.R. et al., The effect of roughness on the micromagnetic properties of high moment multilayer films, J. Phys. D: Appl. Phys. 40 (2007), pp. 3991-3997.

Park, C. et al., Effect of Adjacent Layers on Crystallization and Magnetoresistance in CoFeB/MgO/CoFeB Magnetic Tunnel Junction, IEEE Transactions on Magnetics, vol. 42, No. 10, Oct. 2006, pp. 2639-2641.

Kim, K-S et al., Effect of Nitrogen Incorporation to Oxidation Process on the Reliability of Magnetic Tunnel Junctions, IEEE Transactions on Magnetics, vol. 42, No. 1, Jan. 2006, pp. 2-4.

Yang, T. et al., Estimation of local and nonlocal contributions to the current-induced magnetization switching, Phys. Rev. B 74, 153301 (2006), 4 pp.

MacGillivray, G., Flash Memory Trends & Perspectives, Semiconductor Insights, 24 pp.

Marukame, T. et al., Highly Spin-Polarized Tunneling in Fully Epitaxial Magnetic Tunnel Junctions Using Full-Heusler Alloy Co2Cr0.6Fe0.4Al Thin Film and MgO Tunnel Barrier, IEEE Transactions on Magnetics, vol. 42, No. 10, Oct. 2006, pp. 2652-2654.

Tsunekawa, K. et al., Huge Magnetoresistance and Low Junction Resistance in Magnetic Tunnel Junctions With Crystalline MgO Barrier, IEEE Transactions on Magnetics, vol. 42, No. 2, Feb. 2006, pp. 103-107.

Boslet, M., IBM to reveal chip advance, Nanotechnology Boosts Products' Speed, Efficiency, Mercury News, 3 pp.

Sharma, M. et al., Inversion of Spin Polarization and Tunneling Magnetoresistance in Spin-Dependent Tunneling Junctions, Physical Review Letters, vol. 82, No. 3, Jan. 18, 1999, pp. 616-619.

Guhr, I.L. et al., Magnetization reversal in exchange biased nanocap arrays, J. Phys. D: Appl. Phys. 40 (2007), pp. 3005-3010.

Ohsawa, Y., Magnetoresistance and Current-Driven Resistance Change Measurements in NiFe Film With a Nanoconstriction, IEEE Transactions on Magnetics, vol. 42, No. 10, Oct. 2006, pp. 2615-2617.

Mendes, M.J., Manipulation of Magnetization by Spin Polarized Current in GMR Devices, Rice University, Nanostructures and Nanotechnology I, Fall 2005, 12 pp.

Lee, J. et al., Nano Spin Transistor, 33 pp.

Braganca, P.M. et al., Reducing the critical current for short-pulse spin-transfer switching of nanomagnets, Appl. Phys. Lett. 87, 112507 (2005), 3 pp.

Chen, S-P et al., Spin Accumulation from the Spin Hall Effect Studied Using the Effective Mean-Free-Path Model, IEEE Transactions on Magnetics, vol. 42, No. 10, Oct. 2006, pp. 2667-2669.

Zheng, Y.K. et al., Spin Flop Switching of the Guided Synthetic Antiferromagnet MRAM, IEEE Transactions on Magnetics, vol. 42, No. 10, Oct. 2006, pp. 2742-2744.

Joly, L. et al., Spin Motion of Electrons Upon Reflecting From Ferromagnetic Surfaces, IEEE Transactions on Magnetics, vol. 42, No. 10, Oct. 2006, pp. 2645-2648.

Zhu, X. et al., Spin Torque and Field-Driven Perpendicular MRAM Designs Scalable to Multi-Gb/Chip Capacity, IEEE Transactions on Magnetics, vol. 42, No. 10, Oct. 2006, pp. 2739-2741.

Albert, F.J. et al., Spin-polarized current switching of a Co thin film nanomagnet, Appl. Phys. Lett., vol. 77, No. 23, Dec. 4, 2000, pp. 3809-3811.

Zutic, I. et al., Spintronics: Fundamentals and applications, Reviews of Modern Physics, vol. 76, Apr. 2004, pp. 323-410.

Jin, W. et al., Spin-Wave Excitations in Nanopillars With Perpendicular Polarizers, IEEE Transactions on Magnetics, vol. 42, No. 10, Oct. 2006, pp. 2682-2684.

Shimomura, N. et al., Switching Current Fluctuation and Repeatability for MRAM With Propeller-Shape MTJ, IEEE Transactions on Magnetics, vol. 42, No. 10, Oct. 2006, pp. 2757-2759.

Apalkov, D. et al., Temperature Dependence of Spin Transfer Switching in Nanosecond Regime, IEEE Transactions on Magnetics, vol. 42, No. 10, Oct. 2006, pp. 2685-2687.

Kumar, S.B. et al., The Effect of Spreading Resistance on the Magnetoresistance of Current-Perpendicular-to-Plane Spin Valves With Patterned Layers, IEEE Transactions on Magnetics, vol. 42, No. 10, Oct. 2006, pp. 3788-3790.

Serpico, C. et al., Thermal Stability in Uniaxial Nanomagnets Driven by Spin-Polarized Currents, IEEE Transactions on Magnetics, vol. 42, No. 10, Oct. 2006, pp. 2679-2681.

Daibou, T. et al., Tunnel Magnetoresistance Effect in CoFeB/MgO/CoxFeSi and Co2MnSi Tunnel Junctions, IEEE Transactions on Magnetics, vol. 42, No. 10, Oct. 2006, pp. 2655-2657.

Stine, B.E. et al., The Physical and Electrical Effects of Metal-Fill Patterning Practices for Oxide Chemical-Mechanical Polishing Processes, IEEE Transactions on Magnetics, vol. 45, No. 3, Mar. 1998, pp. 665-679.

Lee, J.W. et al., A Planarization Model in Chemical Mechanical Polishing of Silicon Oxide Using High Selective CeO2 Slurry, Samsung Electronics, 1 p.

Nguyen, V.H. et al., Hybrid CMP process for copper and ultra low-k materials integration, 2 pp.

Zhang, J. et al., Automated Process Control of Within-Wafer and Wafer-to-Wafer Uniformity in Oxide CMP, CMP-MIC Mar. 2002, 6 pp.

Karuppiah, L. et al., Overview of CMP Process Control Strategies, Applied Materials, TFG Division, Sunnyvale, CA, 10 pp.

Wijekoon, K. et al., Minimization of Metal Loss during Chemical Mechanical Planerization of Copper-Oxide and Copper-Low k Damascene Structures, CMP-MIC Mar. 2002, 4 pp.

Healey, J., Current Technical Trends: Dual Damascene & Low-k Dielectrics, Threshold Systems, 2002, 6 pp.

Lai, J-Y et al., Evolution of Copper-Oxide Damascene Structures in Chemical Mechanical Polishing, J. Electrochem. Soc., 149 (1), 2002, pp. G41-G50.

Chen, L., Breakthrough technology for CMP, Semiconductor Fabtech—24th Ed., pp. 137-141.

Araswat, EE311/Cu Interconnect, Stanford University, 18 pp.

Chang, R.Z. et al., Modeling the electrical effects of metal dishing due to CMP for on-chip interconnect optimization, University of California Postprints, 2004, Paper 52, 9 pp.

Wolf, P.J., Overview of Dual Damascene Cu/Low-k Interconnect, International Sematech, Aug. 14, 2003, 21 pp.

Buehler, M., CMP Challenges for 32nm, Semicon West 2007, Jul. 2007, 21 pp.

Lai, J-Y, Mechanics, Mechanisms, and Modeling of the Chemical Mechanical Polishing Process, MIT, Feb. 2001, 314 pp.

Wallace, R.M., New Devices and Materials for 32nm and Beyond, Semicon West 2007, 15 pp.

Technology backgrounder: High-k gate oxides, IC Knowledge 2002, 3 pp.

Hoover, C., Enabling Materials for Contact Metallization, Advanced Processes for Advanced Devices, Jul. 2007, 16 pp.

Stokbro, K., Nanoelectronics modeling platform, Atomisitx Inc., 12 pp.

Arghavani, R., Technologies to Enable High-k/Metal Gate Implementation, Semicon West 2007, Jul. 17, 2007, 20 pp.

The Microscopic Twelve Point Probe, Capres A/S, 1 p.

Petersen, C.L., The Four-Point Probe, Thesis at the Technical University of Denmark, Feb. 1999, 110 pp.

SPM-CIPTech, APRES A/S, 1 p.

SPC-CIPTech (Ver. 3) Technical Specifications (rev. Jan. 2006), 4 pp.

Karpan, V.M. et al., Graphite and graphene as perfect spin filters, Feb. 1, 2007, 5 pp.

Cherian, J.G., Quantum Electrodynamics in Graphene, Kutztown University of PA, Physics REU 2006, Univ. of Washington, 13 pp.

Parkin, S., Magnetic Race-Track Memory: Current Induced Domain Wall Motion!, IBM Corporation, 2005, 60 pp.

Hajto, J. et al., Quantized Electron Transport in Amorphous-Silicon Memory Structures, Phys. Rev. Lett., vol. 66, No. 14, Apr. 8, 1991, pp. 1918-1921.

Rossel, C. et al., Electrical current distribution across a metal-insulator-metal structure during bistable switching, J. Appl. Phys., vol. 90, No. 6, Sep. 15, 2001, pp. 2892-2898.

Yuasa, S. S et al., Characterization of growth and crystallization processes in CoFeB/MgO/CoFeB magnetic tunnel junction structure by reflective high-energy electron diffraction, Appl. Phys. Lett. 87, 242503 (2005), 3 pp.

Hayakawa, J. et al., Dependence of Giant Tunnel Magnetoresistance of Sputtered CoFeB/MgO/CoFeB Magnetic Tunnel Junctions on MgO Barrier Thickness and Annealing Temperature, JJAP, vol. 44, No. 19, 2005, pp. L587-L589.

Hayakawa, J. et al., Effect of high annealing temperature on giant tunnel magnetoresistance ratio of CoFeB/MgO/CoFeB magnetic tunnel junctions, Appl. Phys. Lett. 89, 232510 (2006), 3 pp.

Lee, Y.M. et al. Giant tunnel magnetoresistance and high annealing stability in CoFeB/MgO/CoFeB magntic tunnel junctions with synthetic pinned layer, Appl. Phys. Lett. 89, 042506 (2006), 3 pp.

FEI Company Product Data, VectraVision System, FIB System for Advanced Circuit Editing, 2003, 4 pp.

FEI Company, Tools for Nanotech, CoppeRx II for Mixed-Field FIB Deprocessing, 2006, 1 p.

MoberlyChan, W.J. et al., Fundamentals of Focused Ion Beam Nanostructural Processing: Below, At, and Above the Surface, MRS Bulletin, vol. 32, May 2007, pp. 414-432.

Abstracts, 52nd Magnetism and Magnetic Materials Conference, Nov. 2007, 143 pp.

Zhu, J., Microwave-assisted magnetic recording, International Storage Technology Symposium, Jun. 18-21, 2007, 35 pp.

Kryder, M.H., Perspective on Future Storage Technologies, International Storage Technology Symposium, Jun. 18-21, 2007, 35 pp.

Wood, R. et al., From Rotating- to Solid-State- to 3D-Storage?, Brainstorming the Future, International Storage Technology Symposium, Jun. 18-21, 2007, 6 pp.

Rosen, H., Nano-Bio-Magnetic Horizons, International Storage Technology Symposium, Jun. 18-21, 2007, 14 pp.

Komineas, S., Propagating Coherent Structures in Nanowires, International Storage Technology Symposium, Jun. 18-21, 2007, 12 pp.

Knight, G., Probe-Based Storage: Mechanical Access on a Nano-Scale, International Storage Technology Symposium, Jun. 18-21, 2007, 16 pp.

Knight, G., Semiconductor/Flash Memory Overview, International Storage Technology Symposium, Jun. 18-21, 2007, 19 pp.

Theodonis, I., Spin Transfer Torque (STT) in Magnetic Tunnel Junctions, International Storage Technology Symposium, Jun. 18-21, 2007, 21 pp.

Rohrmann, H., Multilayer and Granular Films on Nanospheres, International Storage Technology Symposium, Jun. 18-21, 2007, 41 pp.

Pearton, S.J. et al., Dry Etching of MRAM Structures, Mat. Res. Soc. Symp. Proc., vol. 614, 2000, 11 pp.

Yung, R.B. et al., Control of Chlorine Inductively Coupled Plasma Using Optical-Emission Spectroscopy, J. Elec. Mat., vol. 31, No. 10, 2002, pp. 994-998.

Ditizio, R. et al., Memory: MRAM Design, Cell Shape and Patterning Considerations for Magnetic Random Access Memory (MRAM) Fabrication, Semiconductor Manufacturing Magazine, pp. 90-96.

Wong, D.F. et al., Magnetic mesa structures fabricated by reactive ion etching with CO/NH3/Xe plasma chemistry for an all-silicon quantum computer, Nanotechnology 16 (2005), pp. 990-994.

Lee, J.W. et al., High-density plasma etching of CoFeSiB magnetic films with hard mask, Journal of Magnetism and Magnetic Materials 304 (2006), pp. c282-c284.

Mukai, T. et al., High-Performance and Damage-Free Magnetic Film Etching using Pulse-Time-Modulated Cl2 Plasma, Jpn. J. Appl. Phys., vol. 45, No. 6B (2006), pp. 5542-5544.

Park, I.H. et al., Nanometer-sized etching of magnetic tunnel junction stack for magnetic random access memory, Journal of Magnetism and Magnetic Materials 304 (2006), pp. c264-c266.

Ruzic, D., Highlights in Plasma Science from around the world, Plasma Material Interaction Group, Univ. of Illinois, Sep. 2006, 55 pp.

Shin, B. et al., Etch Characteristics of CoFeSiB Magnetic Films Using Inductively Coupled Plasma Reactive Ion Etching for Magnetic Random Access Memory, Integrated Ferroelectrics 78, 2006. pp. 223-243.

Takahashi, S. et al., Ion-Beam-Etched Profile Control of MTJ Cells for Improving the Switching Characteristics of High-Density MRAM, IEEE Transactions on Magnetics, vol. 42, No. 10, Oct. 2006, pp. 2745-2747.

Plasma Lab C.Y.C.U., 26 pp.

Etching, Feb. 20, 2005, 110 pp.

ISSCC-2007: Hitachi/Tohuku Univ; Paper D26-5, 12 pp.

Reactive Ion Etching of Magnetic Materials, ISSCC-2007: Hitachi/Tohuku Univ; Paper D26-5, 12 pp.

Rack, P.D., Plasma Etching Outline, Univ. of Tennessee, 34 pp.

An Introduction of Etch Process, Hynix, 69 pp.

Ricci, A., Dry Etch Process Application Note, Pall Microelectronics ABG-106-0405, 6 pp.

Volkert, C.A. et al., Focused Ion Beam Microscopy and Micromachining, MRS Bulletin, vol. 32, May 2007, pp. 389-400.

Mayer, J. et al., TEM Sample Preparation and FIB-Induced Damage, MRS Bulletin, vol. 32, May 2007, pp. 400-407.

Jung, K.B. et al., Electron Cyclotron Resonance Plasma Etching of Materials for Magneto-Resistive Random Access Memory, J. Elec. Mater., vol. 26, No. 11, 1997, pp. 1310-1313.

Balke, B. et al., Mn3Ga, a compensated ferrimagnet with high Curie temperature and low magnetic moment for spin torque transfer applications, Appl. Phys. Lett. 90, 152504 (2007), 3 pp.

Demidov, V.E. et al., Effect of spin-polarized electric current on spin-wave radiation by spin-valve nanocontacts, Appl. Phys. Lett. 90, 172508 (2007), 3 pp.

Laribi, S. et al., Reversible and irreversible current induced domain wall motion in CoFeB based spin valves stripes, Appl. Phys. Lett. 90, 232505 (2007), 3 pp.

V600FIB System, The Most Efficient, Flexible and Cost-effective Device Modification Tool Available for Today's Semiconductor Lab, FEI Company Product Data 2006, 4 pp.

Seo, S-M. et al., Effect of shape anisotropy on threshold current density for current-induced domain wall motion, Appl. Phys. Lett. 90, 252508 (2007), 3 pp.

CMP Technology, 14 pp.

Zhang, S., Current research in current-driven magnetization dynamics, University of Missour-Columbia, Feb. 14, 2006, 48 pp.

Mahorowala, A. et al., Etching of polysilicon in an Inductively Coupled Cl2 and HBr Discharges: III. Photoresist Mask Faceting, Sidewall Deposition, and Microtrenching, Mass. Inst. of Technology, 19 pp.

Consolo, G. et al., Influence of Different Spatial Distributions of Current Density and Spin-Torque Efficiency in the Dynamics of Point-Contact Devices, IEEE Transactions on Magnetics, vol. 43, No. 6, Jun. 2007, 2827-2829.

Guo, J. et al., Effect of Gilbert Damping Term on the Current Induced Magnetization Switching of Ring-Shaped Spin Valve Structures, IEEE Transactions on Magnetics, vol. 43, No. 6, Jun. 2007, 2923-2925.

Lee, J.M. et al., Spin Transfer Magnetization Switching Read/Write Cycle Test in MgO-Based Magntic Tunnel Junctions, IEEE Transactions on Magnetics, vol. 43, No. 7, Jul. 2007, 3349-3353.

Zhu, X. et al., Effect of Damping Constant on Magnetic Switching in Spin Torque Driven Perpendicular MRAM, IEEE Transactions on Magnetics, vol. 43, No. 6, June 2007, 2349-2351.

Myers, E.B. et al., Interplay of Spin-Transfer Torques and Thermal Activation in Nanomagnet Reversal, Cornell University, 14 pp.

Lithography, Lecture 15 (Alignment and Exposure), Semiconductor Manufacturing Technology, Chapters 13-15, 71 pp.

delMoral, A., Magnetostriction: fundamental principles and novel magneto-strictive materials, Europhysics News (2003) vol. 34, No. 6., 9 pp.

Lammers, D., MRAM debut cues memory transition, Jul. 10, 2006, 1 p.

Edwards, D.M., et al., Theory of spin current in magnetic nanopillars for zero-field microwave generation, J. Phys.: Condens. Matter 19 (2007) 165210, 8 pp.

Economikos, L. et al., STI Planarization Using Fixed Abrasive Technology, Feb. 2, 2002, 1 p.

Cu Damascene Process, 6 pp.

Parkin, S., The Spin on Electronics!, Jan. 29, 2008, 1 p.

Barnas, J. et al., Current-induced switching in spin-valve structures, phys. stat. sol. (b) 244, No. 7, pp. 2304-2310.

Carpentieri, M. et al., Micromagnetic Investigation of Precession Dynamics in Magnetic Nanopillars, IEEE Transactions on Magnetics, vol. 43, No. 6, Jun. 2007, pp. 2935-2937.

He, J. et al., Switching speed distribution of spin-torque-induced magnetic reversal, J. Appl. Phys. 101, 09A501 (2007), 3 pp.

Persson, J. et al., Phase-locked spin torque oscillators: Impact of device variability and time delay, J. Appl. Phys. 101, 09A503 (2007), 3 pp.

Kim, W.J. et al., Effect of ac on current-induced domain wall motion, J. Appl. Phys. 101, 09A504 (2007), 3 pp.

Serpico, C. et al., Power spectrum of current-induced magnetization dynamics in uniaxial nanomagnets, J. Appl. Phys. 101, 09A507 (2007), 3 pp.

Finocchio, G. et al., Magnetization dynamics in CoFe/AlO/Permalloy and CoFe/MgO/Permalloy magnetic tunnel junctions, J. Appl. Phys. 101, 09A508 (2007), 3 pp.

Zhou, Y. et al., Intrinsic phase shift between a spin torque oscillator and an alternating current, J. Appl. Phys. 101, 09A510 (2007), 3 pp.

Consolo, G. et al., Influence of the Oersted field in the dynamics of spin-transfer microwave oscillators, J. Appl. Phys. 101, 09C108 (2007), 3 pp.

Devolder, T. et al., Spin transfer oscillators emitting microwave in zero applied magnetic field, J. Appl. Phys. 101, 063916 (2007), 5 pp.

Maat, S. et al., Magnetotransport propeties and spin-torque effects in current perpendicular to the plane spin valves with Co-Fe-Al magnetic layers, J. Appl. Phys. 101, 093905 (2007), 6 pp.

Jalil, M.B.A. et al, Layer thickness and angular dependence of spin transfer torque in ferromagnetic trilayers, J. Appl. Phys. 101, 124314 (2007), 4 pp.

Mizushima, K. et al., Analytical expression of output power spectra of spin-transfer nano-oscillators, Journal of Magnetism and Magnetic Materials 316 (2007) c960-c962.

Meier, G. et al., Current-induced domain-wall motion in permalloy semi rings, Journal of Magnetism and Magnetic Materials 316 (2007) c966-c968.

Slonczewski, J.C. et al., Theory of voltage-driven current and torque in magnetic tunnel junctions, Journal of Magnetism and Magnetic Materials 310 (2007) 169-175.

Consolo, G. et al., Spin-torque switching in Py/Cu/Py and Py/Cu/CoPt spin-valve nanopillars, Journal of Magnetism and Magnetic Materials 316 (2007) 492-495.

Houssameddine, D. et al., Spin-torque oscillator using a perpendicular polarizer and a planar free layer, Nature Materials, vol. 6, Jun. 2007, pp. 447-453.

Kent, A., A nanomagnet oscillator, Nature Materials, vol. 6, Jun. 2007, pp. 399-400.

Boulle, O. et al., Shaped angular dependence of the spin-transfer torque and microwave generation without magnetic field, Nature Physics, vol. 3, Jul. 2007, pp. 492-497.

Pribiag, V.S. et al., Magnetic vortex oscillator driven by d.c. spin-polarized current, Nature Physics, vol. 3, Jul. 2007, pp. 498-503.

Vanhaverbeke, A. et al., Simple model of current-induced spin torque in domain walls, Physical Review B 75, 024411 (2007), 5 pp.

Devolder, T. et al., Distribution of the magnetization reversal duration in subnanosecond spin-transfer switching, Physical Review B 75, 064402 (2007), 5 pp.

Pareek, T.P., Spin-orbit-induced torque in a collinear spin valve: A possible route to design fast magnetic memory, Physical Review B 75, 115308 (2007), 6 pp.

Pufall, M.R. et al., Low-field current-hysteretic oscillations in spin-transfer nanocontacts, Physical Review B 75, 140404 (R) (2007), 4 pp.

Berger, L., Relation between damping, current-induced torques, and wall resistance for domain walls in magnetic nanowires, Physical Review B 75, 174401 (2007), 5 pp.

Yang, S. et al., Spin-transfer-torque-driven domain-wall dynamics in Permalloy nanowires, Physical Review B 75, 220403(R) (2007), 4 pp.

Wei, Z. et al., Changing Exchange Bias in Spin Valves with an Electric Current, PRL 98, 116603 (2007), 4 pp.

Hayakawa, J. et al., Effect of high annealing temperature on giant tunnel magnetoresistance ratio of CoFeB/MgO/CoFeB magnetic tunnel junctions, Appl. Phys. Lett. 89, 232510 (2006), 3 pp.

Lee, Y.M. et al., Giant tunnel magnetoresistance and high annealing stability in CoFeB/MgO/CoFeB magnetic tunnel junctions with synthetic pinned layer, Appl. Phys. Lett. 89, 042506 (2006), 3 pp.

Yang, T. et al., Current-induced vortex-vortex switching in a nanopillar comprising two Co nano-rings, Appl. Phys. Lett. 90, 092505 (2007), 3 pp.

Xi, H. et al., Spin waves excited by dc currents injected into single ferromagnetic thin films, Phys. Rev. B 75, 174411 (2007), 8 pp.

Consolo, G. et al., Magnetization dynamics in nanocontact current controlled oscillators, Phys. Rev. B 75, 214428 (2007), 6 pp.

SpinAps Agenda, Abstracts, Mar. 17-19, 2006.

Coyne, J., Storage Market: Opportunities, Myths and Facts, Western Digital, May 17, 2007, 24 pp.

Xu, Y. et al., In Situ ordering of FePt thin films with face-centered-tetragonal (001) texture on Cr100-xRux underlayer at low substrate temperature, App. Phys. Lett., vol. 80, No. 18, May 6, 2002, pp. 3325-3327.

Grollier, J. et al., Spin-polarized current induced switching in Co/Cu/Co pillars, App. Phys. Lett., vol. 78, No. 23, Jun. 4, 2001, pp. 3663-3665.

Sun, C.J. et al., Epitaxial L1o FePt magnetic thin films sputtered on Cu (001), App. Phys. Lett., vol. 82, No. 12, Mar. 24, 2003, pp. 1902-1904.

Yagami, K. et al., Low-current spin-transfer switching and its thermal durability in a low-saturation-magnetization nanomagnet, App. Phys. Lett., vol. 85, No. 23, Dec. 6, 2004, pp. 5634-5636.

Wang, J-P et al., Composite media (dynamic tilted media) for magnetic recording, App. Phys. Lett. 86 (2005), 3 pp.

Seki, T. et al., Spin-polarized current-induced magnetization reversal in perpendicularly magnetized L1o-FePt layers, App. Phys. Lett. 88 (2006), 3 pp.

Gu, J. et al., Distributed Active Decoupling Capacitors for On-Chip Supply Noise Cancellation in Digital VLSI Circuits, IEEE 2660 Symp. on VLSI Circuits Digest of Tech. Papers, 2 pp.

Durlam, M. et al., A 1-Mbit MRAM Based on 1T1MTJ Bit Cell Integrated With Copper Interconnects, IEEE J. of Solid-State Circuits, vol. 38, No. 5, May 2003, pp. 769-773.

Kim, C.H. et al., PVT-Aware Leakage Reduction for On-Die Caches With Improved Read Stability, IEEE J. of Solid-State Circuits, vol. 41, No. 1, Jan. 2006, pp. 170-178.

Kim, T-H et al., A 0.2 V, 480 kb Subthreshold SRAM With 1 k Cells Per Bitline for Ultra-Low-Voltage Computing, IEEE J. of Solid-State Circuits, vol. 43, No. 2, Feb. 2008, pp. 518-529.

Kim, T-H et al., Silicon Odometer: An On-Chip Reliability Monitor for Measuring Frequency Degradation of Digital Circuits, IEEE J. of Solid-State Circuits, vol. 43, No. 4, Apr. 2008, pp. 874-880.

Tehrani, S. et al., Progress and Outlook for MRAM Technology, IEEE Transactions on Magnetics, vol. 35, No. 5, Sep. 1999, pp. 2814-2819.

Victora, R.H. et al., Composite Media for Perpendicular Magnetic Recording, IEEE Transactions on Magnetics, vol. 41, No. 2, Feb. 2005, pp. 537-542.

Zhu, X. et al., Spin Torque and Field-Driven Perpendicular MRAM Designs Scalable to Multi-Gb/Chip Capacity, IEEE Transactions on Magnetics, vol. 42, No. 10, Oct. 2006, pp. 2739-2741.

Kim, T-H et al., A High-Density Subthreshold SRAM with Data-Independent Bitline Leakage and Virtual Ground Replica Scheme, 2007 IEEE International Solid-State Circuits Conference, 3 pp.

Kil, J. et al., A High-Speed Variation-Tolerant Interconnect Technique for Sub-Threshold Circuits Using Capacitive Boosting, ISLPED '06, Oct. 4-6, 2006, pp. 67-72.

Keane, J. et al., An On-Chip NBTI Sensor for Measuring PMOS Threshold Voltage Degradation, ISLPED '07, Aug. 27-29, 2007, pp. 189-194.

Kim, C.H. et al., PVT-Aware Leakage Reduction for On-Die Caches with Improved Read Stability, 2005 IEEE International Solid-State Circuits Conference, 3 pp.

Sousa, R.C. et al., Tunneling hot spots and heating in magnetic tunnel junctions, J. Appl. Phys., vol. 95, No. 11, Jun. 1, 2004, pp. 6783-6785.

Shen, W.K. et al., In situ epitaxial growth of ordered FePt (001) films with ultra small and uniform grain size using a RuAl underlayer, J. Appl. Phys. 97 (2005), 3 pp.

Zhu, J-G, Pinholes and spin transfer effect in magnetic tunnel junction heads, J. Appl. Phys. 97 (2005), 3 pp.

Parkin, S.S.P. et al., Giant tunnelling magnetoresistance at room temperature with MgO (100) tunnel barriers, Nature Materials, vol. 3, Dec. 2004, pp. 862-867.

Yuasa, S. et al., Giant room-temperature magnetoresistance in single-crystal Fe/MgO/Fe magnetic tunnel junctions, Nature Materials, vol. 3, Dec. 2004, pp. 868-871.

Mangin, S. et al., Current-induced magnetization reversal in nanopillars with perpendicular anisotropy, Nature Materials, vol. 5, Mar. 2006, pp. 210-215.

Kaka, S. et al., Mutual phase-locking of microwave spin torque nano-oscillators, Nature Letters, vol. 437, Sep. 15, 2005, pp. 389-392.

Mancoff, F.B. et al., Phase-locking in double-point-contact spin-transfer devices, Nature Letters, vol. 437, Sep. 15, 2005, pp. 393-395.

Tsoi, M. et al., Excitation of a Magnetic Multilayer by an Electric Current, PRL, vol. 80, No. 19, May 11, 1998, pp. 4281-4284.

Jiang, Y. et al., Effective Reduction of Critical Current for Current-Induced Magnetization Switching by a Ru Layer Insertion in an Exchange-Biased Spin Valve, PRL, vol. 92, No. 16, Apr. 23, 2004, 4 pp.

Rippard, W.H. et al., Injection Locking and Phase Control of Spin Transfer Nano-oscillators, PRL 95, Aug. 5, 2005, 4 pp.

Gu, J. et al., A Switched Decoupling Capacitor Circuit for On-Chip Supply Resonance Damping, 2007 Symp. on VLSI Circuits Digest of Technical Papers, pp. 126-127.

Kim, T-H et al., Silicon Odometer: An On-Chip Reliability Monitor for Measuring Frequency Degradation of Digital Circuits, 2007 Symp. on VLSI Circuits Digest of Technical Papers, pp. 122-123.

Kim, C H et al., A Process Variation Compensating Technique for Sub-90nm Dynamic Circuits, 2003 Symp. on VLSI. Circuits Digest of Technical Papers, pp. 205-207.

Kim, C.H. et al., An On-Die CMOS Leakage Current Sensor for Measuring Process Variation in Sub-90nm Generations, 2005 IEEE International Conference on Integrated Circuit and Technology, 2 pp.

* cited by examiner

CURRENT-CONFINED EFFECT OF MAGNETIC NANO-CURRENT-CHANNEL (NCC) FOR MAGNETIC RANDOM ACCESS MEMORY (MRAM)

CROSS REFERENCE TO RELATED APPLICATIONS

This application claims priority from my previously-filed U.S. Provisional Application No. 60/863,812, entitled "Novel Spintronic Device", filed on Nov. 1, 2006.

BACKGROUND OF THE INVENTION

1. Field of the Invention

The present invention relates generally to non-volatile magnetic memory and/or spintronic devices and particularly to magnetic random access memory (MRAM).

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash (or non-volatile) memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic Ram (or phase-change memory), Ferromagnetic Ram (FeRAM), Magnetic Random Access Memory (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

High density magnetic random access memory (MRAM) has the potential to be the next generation storage device because of its unique advantages, such as non-volatility, i.e. preserving its stored values even when it is not receiving power, radiation hardness, high density, fast speed, and the like. MRAMs may be driven by magnetic field or by spin current. The latter has been known to attract a lot of attention due to its simplified design, reliability, and less cross talk. However, both of these MRAMs, i.e. spin current driven and magnetic field driven, will soon meet their writing power limitation with the memory cell size shrinking.

Since a typical memory cell dimension of a memory cell made of MRAM is less than 100 nanometers (nm) for high density MRAM design, a high shape anisotropy or high magnetocrystalline anisotropy (Ku) material need be used in order to keep a relatively high Ku*V (or KuV) to resist thermal fluctuation, which acts to destroy the stored data. Therefore, the writing power (either through magnetic field or spin current, which highly depends on anisotropy energy constant Ku), has to be greatly increased to overcome the energy barrier between the two stable states. Such high writing power causes problems, particularly in MRAM memory elements having in-plane magnetic anisotropy, i.e. the magnetic moment of the free and fixed layers are parallel to the easy axis. Such problems include as poor compatibility with other electronic devices, high power consumption, and cross talk. However, unless the aspect ratio of a memory element made of the foregoing MRAM is large, thermal instability results. A high aspect ration is clearly undesirable because among other reasons, it prevents scalability and high density memory. Thermal instability is clearly undesirable because it causes unreliable memory.

Thus, there is a need for MRAM with spin current driven type switching (or spin torque transfer effect) with a relatively low switching current density and perpendicular magnetocrystalline anisotropy.

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory.

Briefly, an embodiment of the present invention includes a memory element having a composite (or hybrid) free layer including a first free sub-layer formed on top of the bottom electrode, a nano-current-channel (NCC) layer formed on top of the first free sub-layer, and a second free sub-layer formed on top of the NCC layer, wherein when switching current is applied to the memory element, in a direction that is substantially perpendicular to the layers of the memory element, local magnetic moments of the NCC layer switch the state of the memory element.

These and other objects and advantages of the present invention will no doubt become apparent to those skilled in the art after having read the following detailed description of the preferred embodiments illustrated in the several figures of the drawing.

IN THE DRAWINGS

Figure 4A:
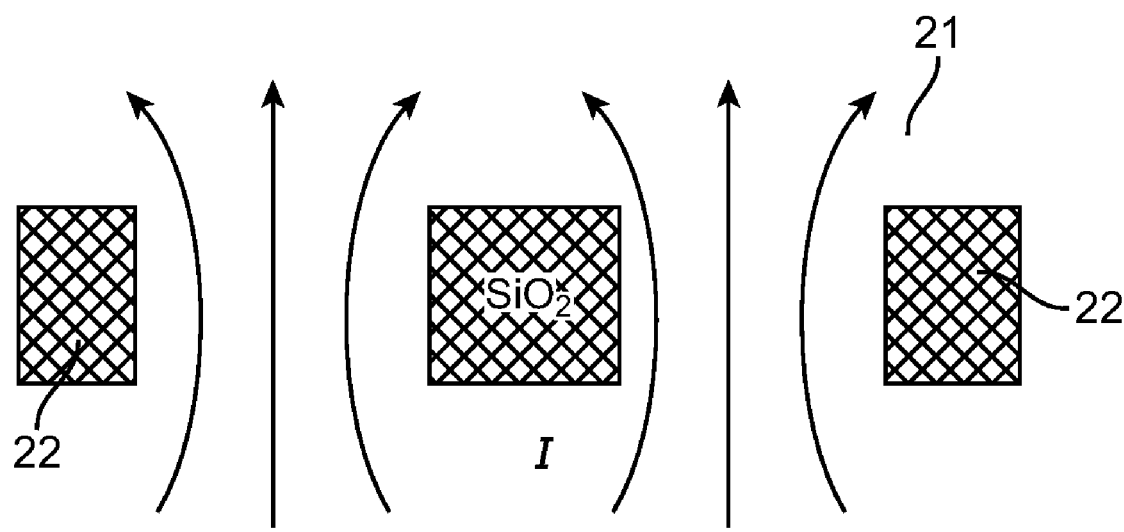
FIG. 4(a) shows the current confined effect of the layer 16 with longitudinal (in-the film plane) magnetic anisotropy.
Figure 4B:
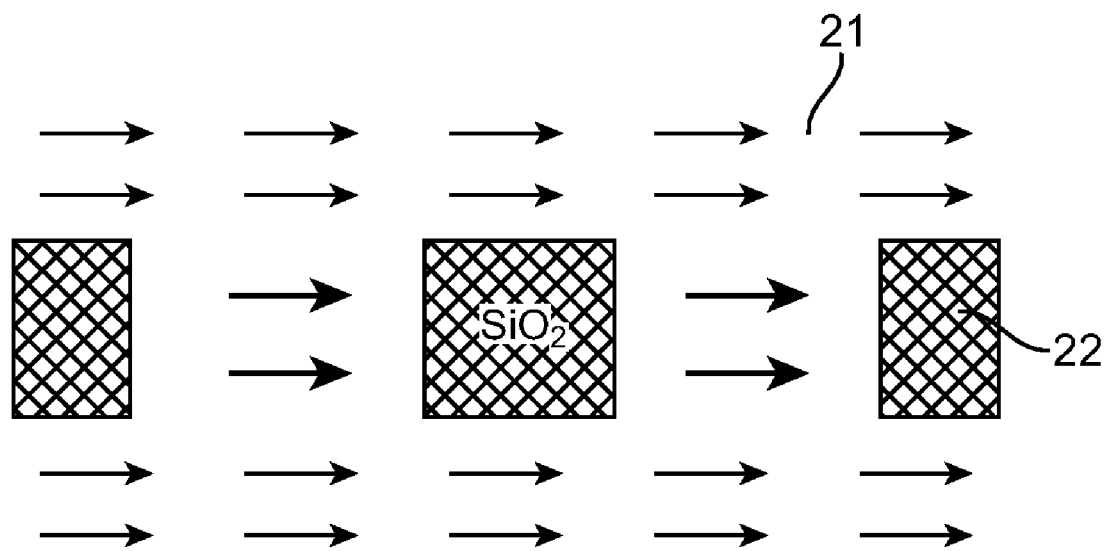

FIG. 4(b) shows the spin configurations (of the memory element 10), with longitudinal anisotropy, as a result of the coupling between the layers 14 and 18 through the magnetic nano-channels of the layer 20.

Figure 5A:
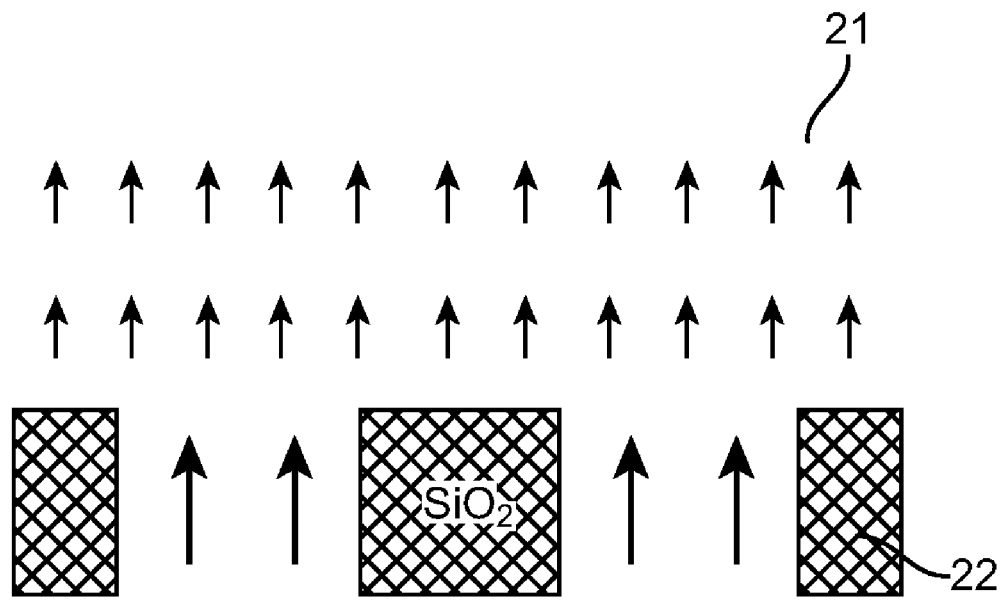

FIG. 5(a) shows the spin configurations in the layer 16 with perpendicular anisotropy (out-of-film plane or perpendicular to the film plane) and remnant status.

Figure 5B:
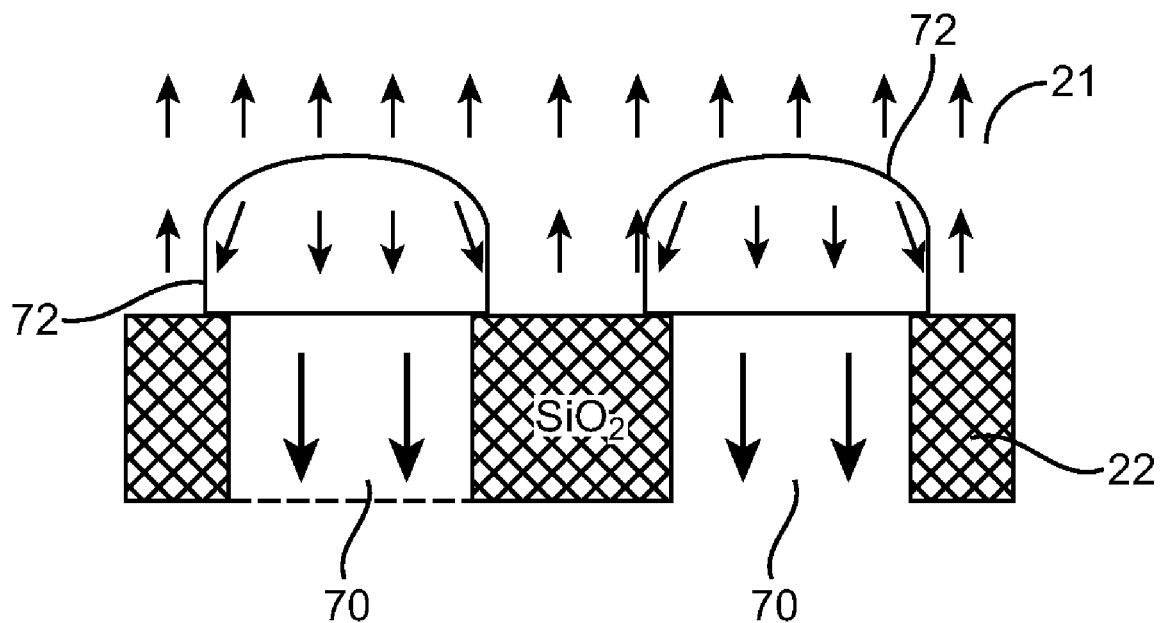

FIG. 5(b) shows the spin configurations in the layer 16 with perpendicular anisotropy and localized spin switching (domain nucleation) with a reverse current or field.

Figure 6A:
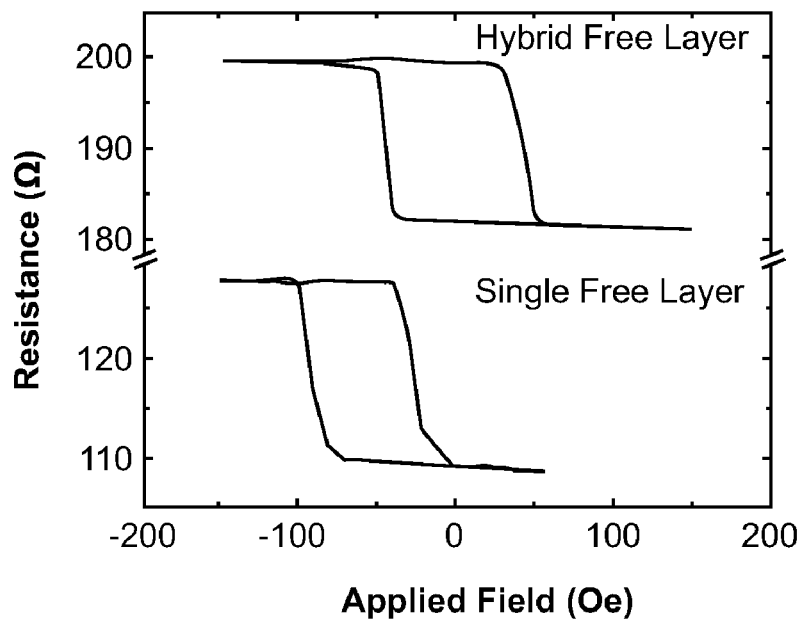

FIG. 6(a) shows a graph of the magnetic field effect (or hysteresis effect) (magnetic field in the x-axis and resistance in the y-axis) of a memory element including the layer 16 and having longitudinal anisotropy and a memory element without the layer 16 (a single free layer) and having longitudinal anisotropy.

Figure 6B:
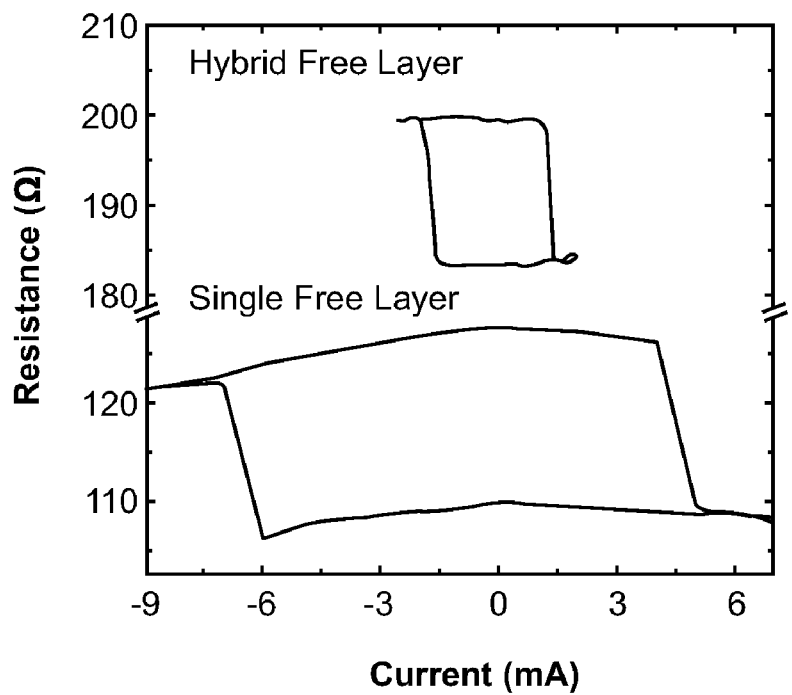

FIG. 6(b) shows a graph of the spin transfer curves (switching current (in the x-axis) vs. resistance (in the y-axis)) for a memory element including the layer 16 and having longitudinal anisotropy and a memory element without the layer 16 (or a single free layer) and having longitudinal anisotropy.

Figure 7A:
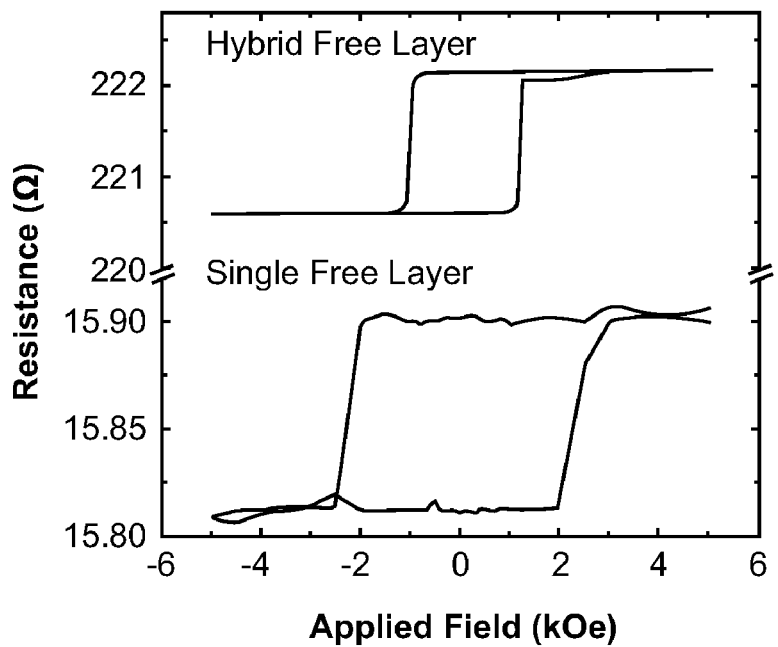

FIG. 7(a) shows a graph of the magnetic field effect (or hysteresis effect) (magnetic field in the x-axis and resistance in the y-axis) of a memory element including the layer 16 and having perpendicular anisotropy and a memory element without the layer 16 (a single free layer) and having perpendicular anisotropy.

Figure 7B:
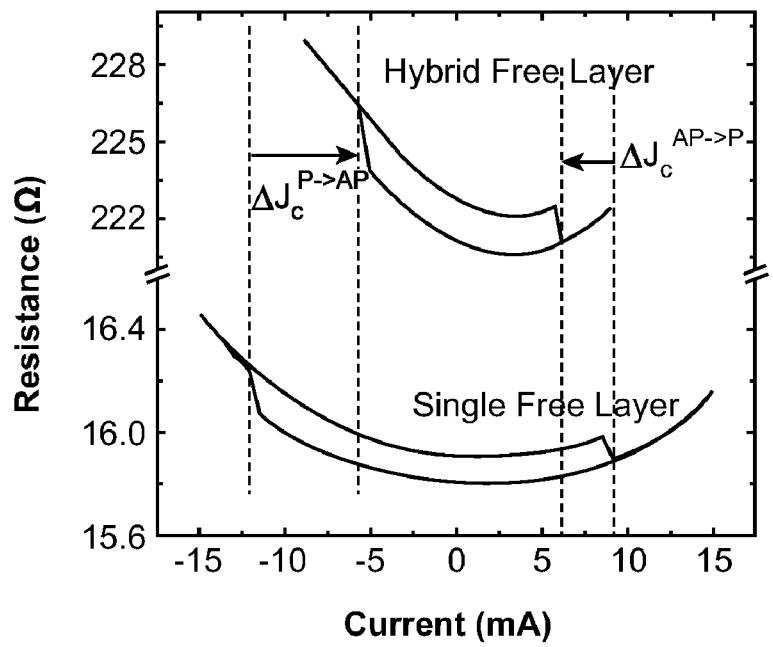

FIG. 7(b) shows a graph of the spin transfer curves (switching current (in the x-axis) vs. resistance (in the y-axis)) for a memory element including the layer 16 and having perpendicular anisotropy and a memory element without the layer 16 (or a single free layer) and having perpendicular anisotropy.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention.

In an embodiment of the present invention, a Magnetic Random Access Memory (MRAM) element of a spin current driven type of switching (or spin torque transfer effect) with a relatively low switching current density includes a composite (or hybrid) free layer, included in the layers of MRAM element. The composite free layer has a nanocurrent-channel (NCC) layer sandwiched by two free sub-layers and having a fixed layer, wherein both the free layer separated from the composite free layer by a spacer layer, the fixed layer and the composite free layer have a perpendicular magnocrystalline anisotropy, i.e. their magnetic moment is perpendicular to the film plane wherein the film plane is the surface of a wafer onto which MRAMs are built.

Alternatively, the magnetic moments of the fixed layer and the composite free layer are longitudinal (or the fixed layer and the composite free layer have a longitudinal magnocrystalline anisotropy), i.e. their magnetic moment is longitudinal (or parallel) to the film plane wherein the film plane is the surface of a wafer onto which MRAMs are built. As will be discussed with reference to the figures below, a memory element 10 includes a composite free layer 16 and a fixed layer 26.

Yet alternatively, any one of the composite free layer or the fixed layer has magnetic moments that are longitudinal or perpendicular.

The magnetic easy axis direction of free layer and fixed layer can be tilted away from the in-plane and perpendicular direction too.

Figure 1:
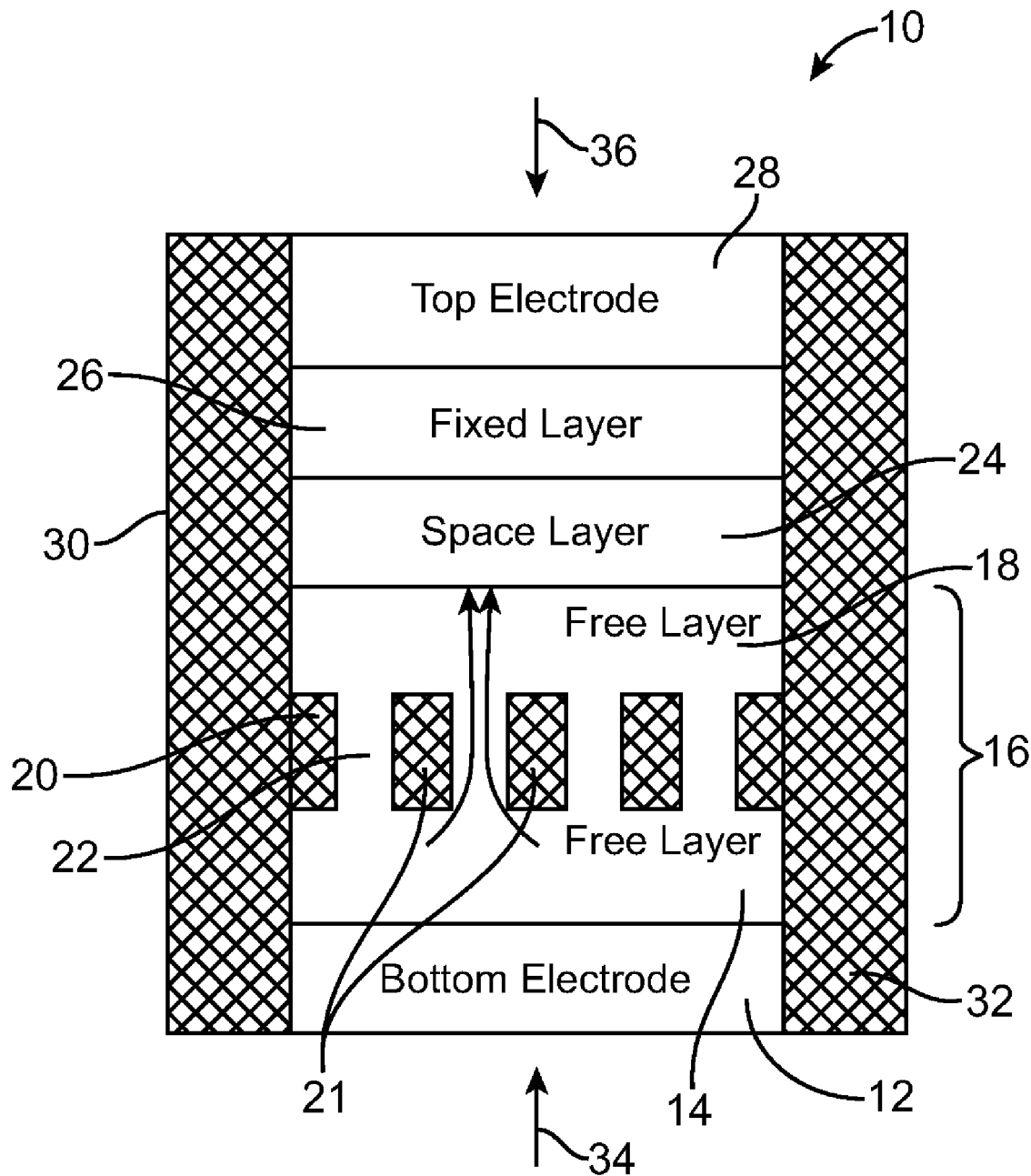
FIG. 1 shows a two dimensional side view of a memory element, in accordance with an embodiment of the present invention.

Referring now to FIG. 1, a two-dimensional view of relevant layers of an MRAM element 10 is shown in accordance with an embodiment of the present invention. The memory element 10 is shown to include a bottom electrode 12, known to be formed on top of a substrate (not shown), on top of which is shown formed a composite (or hybrid) free layer 16, on top of which is shown formed a spacer layer 24, on top of which is shown formed a fixed layer 26 on top of which is shown formed a top electrode 28. At either side of the layers 12, 16, 24, 26 and 28 is shown formed insulation (non-conductive) layers 30 and 32. The layer 16 is shown formed of three layers, a free sub-layer 14, formed on top of the bottom electrode 12, a nano-current-channel (NCC) layer 20 formed on top of the sub-layer 14 and a free sub-layer 18 shown formed on top of the NCC layer 20.

In one embodiment of the present invention, the top and bottom electrodes 28 and 12, are each made of copper (Cu) or aluminum (Al) and their multilayer structures although other similar material is anticipated.

In FIG. 1, the layers 16, 24 and 26 collectively comprise a magnetic tunnel junction (MTJ).

In operation, current is applied at 34 to the bottom electrode 12 and therethrough the layers of the memory element 10, through the top electrode 28. Alternatively, current is applied to the top electrode 28 through the layers of the element 10 down to the bottom electrode 12.

The NCC layer 20 is a composite layer made of magnetic grains (or magnetic nano-channels) and non-magnetic material (and insulating matrix). More specifically, the layer 20 is made of magnetic grains 21, appearing as rectangles in shape, from the view in FIG. 1, dispersed horizontally through the layer 20 and further made of non-magnetic matrix 22. The shape of the grains 21 may be other than rectangular and more conveniently made more circular. The matrix 22 fills in the spaces between the grains 21 with non-magnetic (non-conductive) material.

The layers 14 and 18 are generally made of magnetic material. In an exemplary embodiment, the layers 14 and 18 are each made of alloys having a ferromagnetic primary element, such as cobalt iron (CoFe), iron (Fe), iron nickel (FeNi), iron cobalt nickel (FeCoNi), iron platinum (FePt), such as, but not limited to, $Fe_3Pt$, cobalt platinum (CoPt), such as, but not limited to, $CO_3Pt$, or multi-layers of cobalt and palladium $[Co/Pd]_n$ or cobalt nickel $[Co/Ni]_n$. In some embodiments, additionally, further elements are used in combination with any of the foregoing elements for doping and making fine microstructure such as any one of the following elements: Boron (B), nitrogen (N), carbon (C), silicon (Si) or any other element that has low solubility in the foregoing elements.

The grains 21 are generally made of a conducting material having high spin polarization ratio and being magnetically soft and the matrix 22 is generally made of an insulating material easily grown to form substantially a cylindrical or columnar shape to have lower extra resistance. That is, the hybrid free layer adds resistance to the memory element. Even in the presence of such extra resistance, the magnetic field remains substantially the same as that of a memory element without a hybrid free layer. A graph of showing the magnetic field effects with and without the hybrid free layer is presented herein.

In an exemplary embodiment, the layer 20 may be made of magnesium oxide (MgO), silicon dioxide ($SiO_2$), titanium dioxide ($TiO_2$), alumina ($Al_2O_3$), or any other insulating material.

The layer 24, which is interchangeably referred to as the barrier layer or tunneling layer is made of magnesium oxide (MgO) and may contain a thin layer of magnesium (Mg) to ensure minimal damage to the underlying free layer during the time MgO is deposited, and also to ensure more perfect crystalline growth of the MgO layer. The barrier layer 24 is alternatively made of aluminum oxide ($Al_2O_3$), titanium dioxide ($TiO_2$), germanium (Ge) or other similar insulating material.

It is noted that in some embodiments, the memory element 10 is flipped so that the top electrode is positioned where the bottom electrode appears in FIG. 1 and the fixed layer 26 is formed on top of the top electrode on top of which is formed the layers 18, 20 and 14.

The top and bottom electrodes 28 and 12, respectively, are each made of a conductive material, such as but not limited to copper (Cu) or aluminum (Al). The layer 26 is made of cobalt iron (CoFe), iron (Fe), iron nickel (FeNi), iron cobalt nickel (FeCoNi), iron platinum (FePt), such as, but not limited to, $Fe_3Pt$, cobalt platinum (CoPt), such as, but not limited to, $CO_3Pt$, or multi-layers of cobalt and palladium $[Co/Pd]_n$ or cobalt nickel $[Co/Ni]_n$. In some embodiments, additionally, further elements are used in combination with any of the foregoing elements for doping and making fine microstructure such as any one of the following elements: Boron (B), nitrogen (N), carbon (C), silicon (Si) or any other element that has low solubility in the foregoing elements.

In an exemplary embodiment, the layers 30 and 32 are each made of silicon dioxide ($SiO_2$), however, other types of insulating material is anticipated. In practical applications, during deposition, the layers 30 and 32 are made of and are the same layers.

In an exemplary embodiment, the thicknesses of each of the layers of the memory element 10 are as follows: The bottom electrode 12 is typically less than 100 nanometers (nm) the sub-layer 14 is typically less than 10 nm, the layer 20 is typically less than 10 nm, the sub-layer 18 is typically less than 10 nm the layer 24 is typically less than 5 nm, the layer 26 is typically less than 10 nm, the top electrode 28 is typically less than 100 nm, and the layers 30 and 32 are the layers encapsulating the memory element and separating it from neighboring memory elements, thus, being variable in thickness, as dictated by the manufacturing process.

In an embodiment of the present invention, the memory element 10 is a spin transfer device that has two magneto-resistance states that can be switched from one state to another by directly applying a current from the top to the bottom electrode or from the bottom to the top electrode. The magnetoresistance states refer to the magnetization configuration between the free layer (combination of layers 14 and 18 and 20) and fixed layer 26, in parallel or anti-parallel.

In another embodiment of the present invention, the memory element 10 is a magnetic field switching device for which the magnetic field is generated by the current being applied to lower the switching field.

Figure 2:
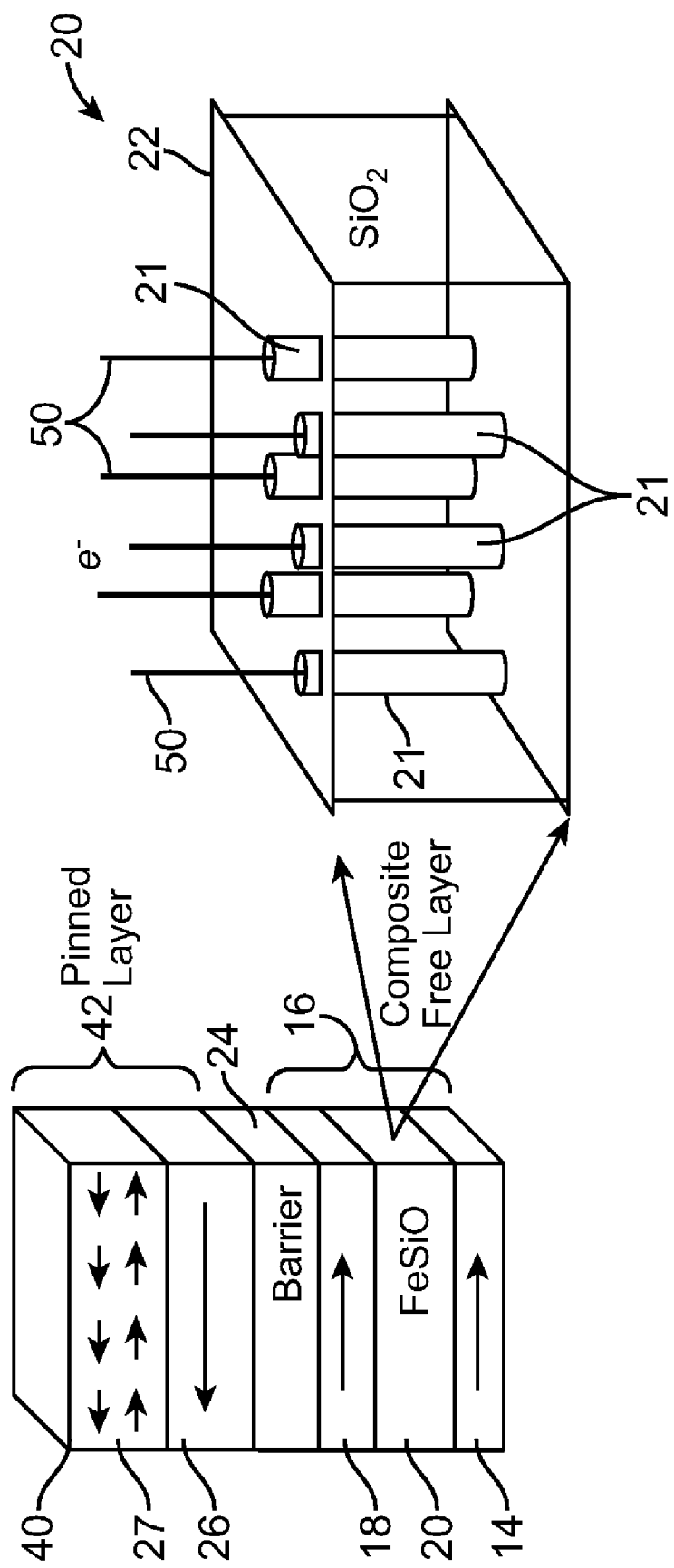
FIG. 2 shows a three dimensional side view of further details of the memory element, in accordance with an embodiment of the present invention.

The memory element 10 is a spin transfer type of device with advantageously lower switching current density in accordance with one embodiment of the present invention. In an exemplary embodiment, the spin current driven type switching (spin torque transfer effect) in the foregoing MTJ structure (including the hybrid free layer), has a relatively low switching current density. The hybrid free layer 16 has a nano-current-channel (NCC) FeSiO layer (or layer 20 in FIG. 1), sandwiched by two CoFe layers (or layers 14 and 18). The NCC layer has magnetic and conducting Fe(Si) grains (or magnetic grains 21) in columnar shape and $SiO_2$ insulator matrix as shown in FIG. 2.

Fe(Si) grains are magnetically coupled with the two CoFe layers. The spin current passes substantially only through the conducting grains (or magnetic grains 21) in the NCC layer (or layer 20) of the memory element 10. This results in high current density in these conducting magnetic grains and thus induces their magnetization switching. Thermal fluctuation caused by local high current density may also contribute to the magnetization switching in these Fe(Si) grains. Because of the existence of the reverse magnetized grains and their coupling to the CoFe layers, the magnetization switching of CoFe layers is easier. The thermal stability factors represented by the equation:

$$\left(\frac{K_u V}{k_B T}\right) \qquad \text{Equation (1)}$$

(wherein Ku represents magnetic anisotropy, V represents the volume of switching unit, the Boltzman constant and T represents temperature) and intrinsic switching current density are known to be affected in the following manner in the presence of the NCC layer. The switching current density is reduced while no impact is realized as to the thermal stability factor. The thermal stability of the composite free layer (or layer 16) at remnant status (zero field or zero current) or reading status (with low sensing current) is determined by the total volume of CoFe layers (or layers 14 and 18) (exchange coupled through Fe(Si) grains) and not degraded by the inserted NCC layer 20. Therefore, the composite free layer structure of the memory element 10 not only reduces the writing power but also keeps a relatively high thermal stability, which provides a practical approach to address the dilemma of the high recording density (small free layer volume, thermal instability) and the high writing power (high Ku materials).

The film plane in FIG. 1 is shown to be in a direction into the plane of the page. In the case where magnetic anisotropy is longitudinal, the magnetic moments are in a direction parallel to the film plane and in the case where the magnetic anisotropy is perpendicular, the magnetic moments are in a direction perpendicular to the film plane.

While discussions in this document are directed to perpendicular magnetic anisotropy by the memory element 10, it is understood that the longitudinal magnetic anisotropy is anticipated. The magnet anisotropy of the composite free layer 16 is magnetocrystalline anisotropy, interface anisotropy or shape anisotropy.

In the case where the memory element has an in-plane or longitudinal magnetic anisotropy, an off-angle, oblique, glancing-angle thin-film deposition (sputtering, evaporation, ion beam deposition, laser beam deposition, or the like), or ion-beam assisted deposition is used to produce in-plane texture for the in-plane magnetocrystalline anisotropy.

In the case of perpendicular anisotropy, perpendicular anisotropy is generated by the magnetocrystalline anisotropy and/or interface anisotropy. The materials used for the composite free layer 16 in this case are chemically ordered L10 phase FePt, CoPt, chemically ordered bct-structured FeCo or ordered Fe16N2, [Co/Pt]n or [Co/Pd]n (n being an integer) or any other superlattice structure.

The magnetization of composite free layer 16 and the fixed layer 26 are perpendicular or out-of-film plane, in accordance with one embodiment of the present invention. In some embodiments, both the composite free layer 16 and the fixed layer 26 or any one of the composite free layer 16 or fixed layer 26 has perpendicular anisotropy, i.e. the magnetic easy axis direction is out of film plane (perpendicular to the film plane). The origin of the perpendicular anisotropy can be from magnetocrystalline anisotropy or shape anisotropy.

Exemplary materials with magnetocrystalline anisotropy are FePt, CoPt, Fe16N2, FePtNi, CoPtNi, Fe/Pt multilayer, Co/Pd multilayer, Co/Ni multilayer and the above alloy or compounds with the third or forth element to refine the structure and properties. The origin of the shape anisotropy can be from the shape of the fixed layer and/or free layer, in which the film thickness (out of film plane) is larger than the device lateral dimension (in film plane).

Examples of applications of a structure including the composite free layer 16, other than MRAM, includes, but is not limited to spin torque oscillators, spin logic devices, and others.

FIG. 2 shows a three dimensional side view of further details of the memory element 10, in accordance with an embodiment of the present invention. The structure of FIG. 2 is shown to form a magnetic tunnel junction (MTJ) formed of a pinned layer 42, the barrier layer 24 and the free layer 16. The barrier layer 16 is shown formed on top of the free layer 16 and the pinned layer 42 is shown formed on top of the barrier layer 24. The pinned layer 42 is shown formed of a pinning layer 27, which is formed between the fixed layer 26 and the top electrode 28 (of FIG. 1) and the layer 26 is shown to have a magnetic moment antiparallel (AP) to the magnetic moments of the sub-layers 14 and 18. The pinning layer 27 is used to fix the magnetic moment of the layer 26. The magnetic moments of the layers 26, 18 and 14 are each shown to be in a direction shown by the direction of the arrow of their respective layer.

It should be appreciated that while the structure of the memory element 10 is described as including an MTJ, in other embodiments, other than an MTJ is employed, such as gain magnetoresistance (GMR) and magnetic diode and other magnetic structures.

In an exemplary embodiment, the pinning layer 27 is made of iridium manganese (IrMn), Platinum manganese (PtMn), or nickel manganese (NiMn). and is typically less than 200 nm in thickness.

An exploded view of the layer 20 is shown on the right side of the FIG. 2 where the grains 21 are shown to each be generally cylindrical in shape with spaces in between shown filled in by $SiO_2$. The grains 21 are generally made of magnetic material, whereas the matrix 22 is made generally of non-magnetic material. When current is applied at 34 (in FIG. 1), electrons flow into the grains 21 in a direction indicated by the direction of the arrows 50 and the spin current passes substantially only through the conducting grains (or magnetic grains 21) in the NCC layer (or layer 20) of the memory element 10. This results in high current density in these conducting magnetic grains and thus induces their magnetization switching. Thermal fluctuation caused by local high current density may also contribute to the magnetization switching in these Fe(Si) grains. Because of the existence of the reverse magnetized grains and their coupling to the CoFe layers, the magnetization switching of CoFe layers is easier.

The layer 20 is a composite free layer or granular free layer, generally made from FeSiO, in an exemplary embodiment, wherein the grains 21 are made of Fe(Si) and the matrix 22 is made of $SiO_2$. The matrix 22 is not limited to an oxide-based material and can be made of other types of insulating material.

The effect of the nano-current-channel of the layer 20 confines the current perpendicularly passing through the element 10, as shown by the direction of the arrows through the layer 16 and increases the local current density to make spin transfer switching easier. Current is confined to travel only through the spaces between the grains 21, or confined current-channel, in the layer 20, which causes lower switching current density.

Switching of the magnetic moment of the free layer 16 from one state to another, such as from parallel relative to the pinned layer 42 to anti-parallel relative to the pinned layer 42, thereby storing a bit state, i.e. '1' or '0', in the element 10. The magnetic moment of each of the grains 21 switches locally, or within the grain, thereby reducing the switching field of the other magnetic layers, such as the sub-layers 14 and 18, which are exchange coupled to the grains 21. This type of exchange coupling effect is desirable because the switching current required to switch the state of the memory element 10 is reduced, by as much as 75% or more as shown below while the aspect ratio of the grains 21 is also lower such as less than 3 or in some cases less than 1. The increased local current density increases the temperature of the grains 21 thus reducing the switching field or current density of the grains 21.

In one embodiment, the current density is reduced by more than 75% although in an optimized memory element structure (by varying the process conditions for depositing the NCC layer and/or thicknesses and/or compositions thereof), the current density may be reduced to one tenth of that which it is currently.

In an exemplary embodiment, the grains 21 are made of Fe, FeSi, FeCo, FeN, FeCoB, FeCoNi, Co, CoPt, or Co alloy. The matrix 22 is made of material such as but not limited to $SiO2$, SiOx, $Al_2O_3$, $TiO_2$, HfO, TaO, ZrO, CoO, or FeO. The ratio of the magnetic conducting region and the insulating region, in the layer 20, in an exemplary embodiment of the present invention, is as follows. The $SiO_2$ boundary dimension is approximately 2-3 nm and the diameter of the FeSi grains is approximately 5 nm.

An exemplary structure of the MTJ 40 having a perpendicular anisotropy with a composite free layer is bottom electrode/FePt/FeCo—SiO2/FePt/FeCoB/MgO/FeCoB/FePt/CrRu/top electrode, wherein the FePt, formed on top of the bottom electrode and the FePt formed on top of the NCC layer made FeCo—SiO2, are the sub-layers of the composite free layer. The perpendicular magnetized FePt layer is L10 chemically ordered or partially chemically ordered for high anisotropy and is replaced by a perpendicular magnetized layer with bct-structured FeCo, ordered Fe16N2, L10 phase CoPt, FeCoPt, [Co/Ni]n, [Co/Pt]n, or [Co/Pd]n.

FeCo in the case where the grains 21 are made therefrom in a FeCo—SiO2 NCC layer, are coupled to the bottom and top FePt layers (or sub-layers of the free layer), FeCo—SiO2 (magnetic NCC layers) are made of Co—SiO2, FeCo—TiO2, FeN—TiO2, FeCo—HfO, or FeCo—TaO. The MgO may be replaced with other barrier materials such as a AlO, CrO2 or other single crystalline structure materials. MgO may also be replaced with Cu, Au in the case where the memory element 10 has a giant magnetoresistance structure rather than having an MTJ. Optionally, a seed layer made of CrRu is formed on top of the bottom electrode 12 for building (002) texture. Other material used to form the seed layer rhodium aluminum (RuAl), TiN, CrW, CrX (X being either tungsten (W), aluminum (Al) or the like). A (001) crystalline structured MgO layer may be optionally formed under a seed layer, the seed layer formed generally on top of the bottom electrode. This will result in high magnetoresistance. Optionally, a (002) textured underlayer formed between the bottom electrode and the seed layer further increases the magnetoresistance.

A typical configuration of a memory element, such as the memory element 10, with an underlayer, seed layer and remaining layers is made of the following: Bottom electrode/FePt/FeCo—SiO2/FePt/FeCoB/MgO/FeCoB//FePt/CrRu/top electrode.

In the case where longitudinal anisotropy is used instead of perpendicular anisotropy, in combination with the NCC layer, while higher densities of memory cells made of such a memory element is achieved, the switching current is nevertheless undesirably high. However, the combination of the composite free layer including an NCC layer and perpendicular anisotropy advantageously reduces switching current density while maintaining high density and therefore scalability of memory cells made of such memory element structures. This is in large part due to current being directed through the channels (or grains 21) and not around the channels in the composite free layer.

Figure 3:
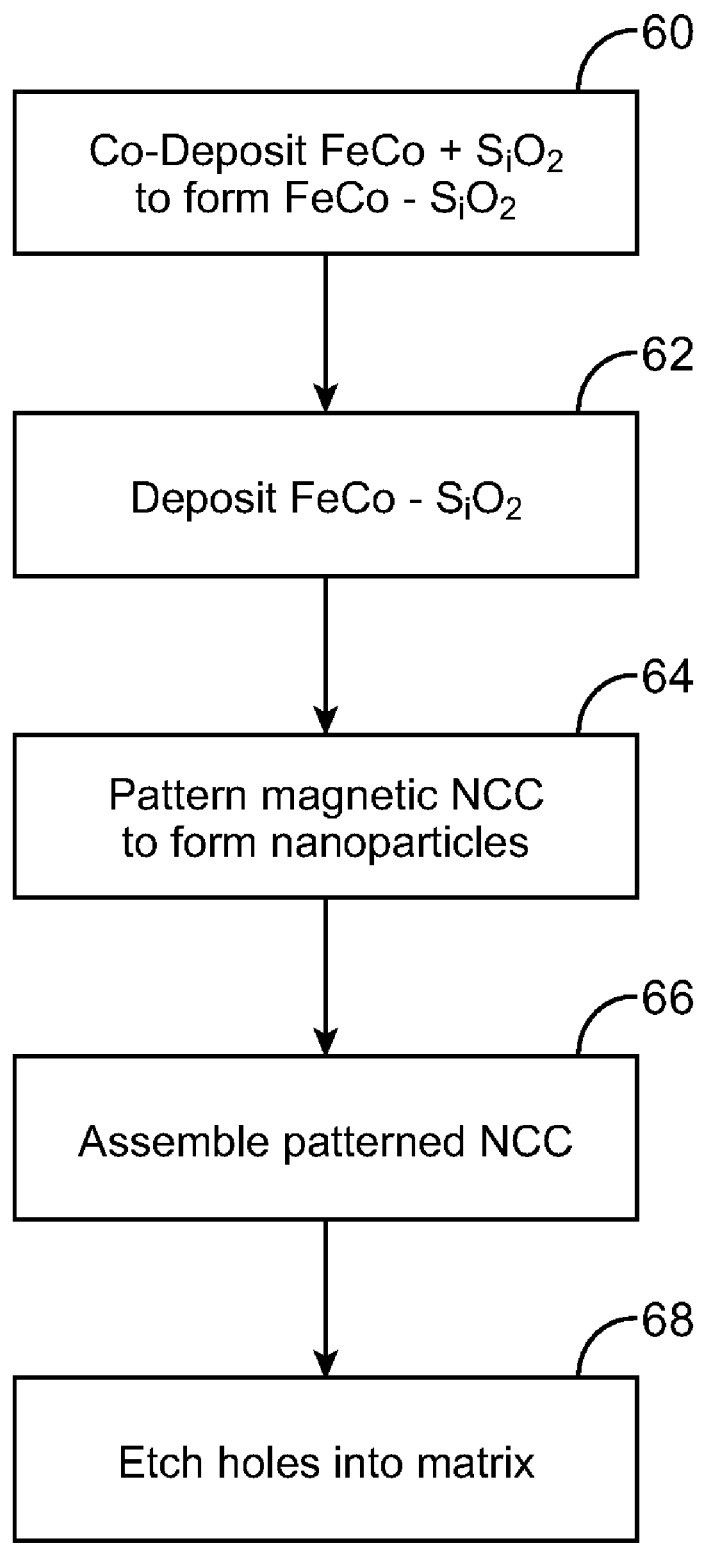
FIG. 3 shows an exemplary method of manufacturing the NCC layer of the memory element, in accordance with a method of the present invention.

An exemplary method of manufacturing the layer 20 is shown in FIG. 3, in accordance with a method of the present invention. In FIG. 3, at step 60, FeCo and SiO2 are co-deposited to form FeCo—SiO2, using any of the following methods: Sputtering, evaporating, laser-depositing, chemical vapor depositing, ion beam depositing or any other such techniques.

Next, at step 62, the co-deposited FeCo—SiO2 is deposited using a composite FeCo—SiO2 source and using methods such as sputtering, evaporating, laser-depositing, chemical vapor depositing or ion beam depositing. Next, at step 64, magnetic NCC is patterned to form magnetic nanoparticles (or grains 21) using electron beam writer and/or phase shift mask lithography processes, well known in the industry. Next, at step 66, the patterned nanoparticles are assembled into insulating matrix (or the matrix 22). Next, at step 68, holes are etched into the insulating matrix by nano-patterning mask (nanoparticle arrays) and filling the holes with a magnetic material, such as FeCo.

The layer 20 can be made by lithography process (either electron beam or phase-shift-mask lithography process) with magnetic or non-magnetic conducting channels and insulating matrix. In this fabrication method, the area ratio of conducting channels over the whole device is substantially smaller, such as reduced to 20% or even 10%. In an extreme case, solely one small channel is made in the layer 20.

In one application of the memory element 10, the memory element 10 is integrated with semiconductor and/or magnetic semiconductor devices such as diodes or transistors to form a plurality of memory cells to which information or data is written and/or read therefrom.

In another application, the memory element 10 is used in a magnetic random access memory cell for information storage. The composite free layer or layer 16 includes the sub-layers and grains 21 discussed and shown herein, where the grains 21 have low switching field and function as the storage layer with magnetization switching from one direction to another. The composite free layer can be perpendicular or longitudinally magnetized.

In yet another application of the memory element 10, it is integrated with magnetic nanowires and nanotubes.

In still another application, the memory element is used for spin torque transfer random access memory cell (SpinRAM). The composite free layer, or layer 16, includes the sub-layers discussed herein and the NCC layer discussed herein wherein the latter, or layer 20, functions as the storage layer with magnetization switching from one state, such as binary value '1', to another state, such as binary value '0', or vice versa. Alternatively, a memory cell made of the memory element 10 stores more than two states because it includes multiple MTJs. This multilevel or multistage storage device is realized by selectively controlling the magnetic NCCs designed with different switching fields by for example, applying different levels of switching current to cause switching of multiple states.

In still another application, an appropriate controllable current is passed through a device made from the memory element 10 and though its composite free layer, and such a device is used for generating microwave with high power efficiency and or power. An array of such devices is made from generating microwave for purpose other than storage, such as communications systems. Still alternatively, the memory element 10 is used for generating high efficient spin waves for communication devices. Still alternatively, the memory element 10 is used for magnetic logic devices, spin transistors and magnetic processors.

FIG. 4(a) shows the current confined effect of the layer 16 with longitudinal anisotropy. As shown in FIG. 4(a), current is substantially confined to traveling in a direction consistent with the direction of the arrows and through the layer 21, avoiding the layer 22.

FIG. 4(b) shows the spin configurations (of the memory element 10), with longitudinal anisotropy, as a result of the coupling between the layers 14 and 18 through the magnetic nano-channels of the layer 20. The spin configuration, in FIG. 4(b) is shown in a direction consistent with the direction to which the arrows point and substantially all parallel with the plane of the page.

FIG. 5(a) shows the spin configurations in the layer 16 with perpendicular anisotropy and remnant status. As shown in FIG. 5(a), current is substantially confined to traveling in a direction consistent with the direction of the arrows (or vertically) and through the layer 21, avoiding the layer 22.

FIG. 5(b) shows the spin configurations in the layer 16 with perpendicular anisotropy and localized spin switching (domain nucleation) with a reverse current or magnetic field. That is, the reverse current is shown at 70 and it is in a direction opposite to the direction of the current through the layer 21. The localized spin switching is shown at 72 causes an increased current density as the conduction electrons can not travel through the non-conducting regions such as formed by the oxides regions of the NCC layer.

FIG. 6(a) shows a graph of the magnetic field effect (or hysteresis effect) (magnetic field in the x-axis and resistance in the y-axis) of a memory element including the layer 16 and having longitudinal anisotropy and a memory element without the layer 16 (a single free layer) and having longitudinal anisotropy. The applied magnetic field (in Orsted or Oe) is shown in the x-axis and the resistance of the memory element is shown in ohms in the y-axis. As shown, the magnetic field affect of the memory element with the layer 16 remains advantageously substantially the same as that of a memory element having a single free layer.

FIG. 6(b) shows a graph of the spin transfer curves (switching current (in the x-axis) vs. resistance (in the y-axis)) for a memory element including the layer 16 and having longitudinal anisotropy and a memory element without the layer 16 (or a single free layer) and having longitudinal anisotropy. The switching current (in milliamps or mA) is shown in the x-axis and the resistance of the memory element is shown in ohms in the y-axis. As shown, the switching current of the memory element with the layer 16 is advantageously substantially lower than that of a memory element having a single free layer.

FIG. 7(a) shows a graph of the magnetic field effect (or hysteresis effect) (magnetic field in the x-axis and resistance in the y-axis) of a memory element including the layer 16 and having perpendicular anisotropy and a memory element without the layer 16 (a single free layer) and having perpendicular anisotropy. FIGS. 7(a) and (b) include data for a memory element with a size of 100 nm in diameter, substantially circular and having a structure that is Ta/[CoFe/Pt]n/Cu/free layer.

In FIG. 7(a), the applied magnetic field (in kilo Oe) is shown at the x-axis and the resistance of the memory element is shown in ohms at the y-axis. As shown, the magnetic field affect of the memory element with the layer 16 remains advantageously substantially the same as that of a memory element having a single free layer.

FIG. 7(b) shows a graph of the spin transfer curves (switching current (in the x-axis) vs. resistance (in the y-axis)) for a memory element including the layer 16 and having perpendicular anisotropy and a memory element without the layer 16 (or a single free layer) and having perpendicular anisotropy. The switching current (in milliamps or mA) is shown at the x-axis and the resistance of the memory element is shown in ohms at the y-axis. As shown, the switching current of the memory element with the layer 16 is advantageously substantially lower than that of a memory element having a single free layer.

The memory element 10 is included in MRAM made of such elements and advantageously offers more tolerance to the distribution of the size, shape and magnetic properties of the devices comprising such memory elements. The memory element 10 is less sensitive to the fabrication process which is one of key challenges for MRAM production.

The various embodiments of the present invention include a memory element with the thermal stability thereof remaining substantially unchanged but the switching field or current needed is substantially reduced. This novel layer is not only for spin transfer type device to lower down the switching current density but also for traditional field switching devices for which the field is generated by the current to lower the switching field.

Both perpendicular magnetic anisotropy and longitudinal magnetic anisotropy are applicable for the memory element structure of the embodiments of the present invention. The magnetic anisotropy of the composite free layer, such as the layer 16, can be magnetocrystalline anisotropy, interface anisotropy and shape anisotropy. The off-angle, or oblique or glancing-angle thin-film deposition (sputtering, evaporation, ion beam deposition, laser beam deposition, etc) and/or ion-beam assisted deposition is used to produce the in-plane texture for the in-plane magnetocrystalline anisotropy. Perpendicular anisotropy in the composite layer is generated by the magnetocrystalline anisotropy and/or interface anisotropy. The materials for the perpendicular anisotropy composite free layer are chemically ordered and $L1_0$ phase FePt, CoPt, chemically ordered bct-structured FeCo and ordered $Fe_{16}N_2$, $[Co/Pt]_n$, and $[Co/Pd]_n$ and other superlattice structures serve as examples. The magnetic NCC layer, or layer 20, consists of magnetic grains and insulating matrix. Materials for magnetic grains are made of material such as Fe, FeSi, FeCo, FeN, FeCoB, FeCoNi, Co. Materials for the insulating matrix are made of material such as $SiO_2$, $SiO_x$, $Al_2O_3$, $TiO_2$, HfO, TaO, ZrO, CoO, FeO, etc. The foregoing material are not the only material that can be used, as discussed above.

An example of an MTJ device with a perpendicular composite free layer as the layer 16 is made of Electrode/FePt/FeCo—SiO2/FePt/FeCoB/MgO/FeCoB//FePt/CrRu/Electrode but is not limited thereto. Perpendicular magnetized FePt layer is $L1_0$ chemically ordered or partially chemically ordered for high anisotropy and can be replaced by a perpendicular magnetized layer with bct-structured FeCo, ordered $Fe_{16}N_2$, $L1_0$ phase CoPt, FeCoPt, |Co/Ni|u, |Co/Pt|u, |Co/Pd|, FeCo grains in FeCo—SiO₂ are coupled to bottom and top FePt layers. FeCo—SiO₂ (magnetic nano-current-channel layers) can be Co—SiO₂, FeCo—TiO₂, FeN—TiO₂, FeCo—HfO, FeCo—TaO, MgO barrier layer can be replaced by other barriers such as AlO, $CrO_2$ or other single crystalline structure materials. MgO can be replaced by Cu, Au, etc, for a giant magnetoresistance structure. CrRu layer on top of the bottom electrode is, but not limited, for building (002) texture. Other seedlayer such as RuAl, CrW, CrX (X=W, Al, or the like) can be used. (001) textured MgO layer can be formed under CrRu layer. Top and bottom electrodes can be Cu and Al and their multilayer structures.

The materials for the NCC layer (FeCo—SiO₂) are not limited to FeCo—Si2. The NCC layer is conducting, with high spin polarization ratio and magnetic soft and the design point for the insulating materials is to form easily the columnar growth in NCC layer to have lower extra resistance. The materials for the perpendicular magnetized layer are not limited to FePt. Other choices are FeN, CoPt, Co alloy, . . . . The spintronic structure is not limited to magnetic tunnel junction (MTJ), it can instead be giant magnetoresistance (GMR) and magnetic diode and other future devices. The methods for making the magnetic nano-current-channel layer in the composite free layer are as follows, but not limited thereto:

a. Co-depositing FeCo and $SiO_2$, depositing methods include sputtering, evaporation, laser-deposition, chemical vapor deposition, ion beam deposition b. Depositing FeCo—$SiO_2$ using a composite FeCo—$SiO_2$ source, depositing methods include sputtering, evaporation, laser-deposition, chemical vapor deposition, ion beam deposition c. Patterning the magnetic nano-current-channels by Electron Beam Writer and/or Phase Shift Mask Lithography processes.

d. Assembling the magnetic nanoparticles into insulating matrix.

e. Etching the holes in insulating matrix by nano-patterning mask (nanoparticle arrays) and filling holes by the magnetic materials (FeCo, etc).

$L1_0$ phase FePt and CoPt and/or FeCoPt and/or FeCoNiPt for the composite free layer can be prepared by the following methods but not limited thereto:
  a. Deposit (001) textured $L1_0$ FeCoNiPt film on (002) textured FeCoB/(001) textured MgO/(002) textured FeCoB(002) by using CrRu or other BCC phase (002) textured seedlayer and/or underlayer directly.
  b. $L1_0$ phase (001) AuCu (001) and/or (001)PtMn and/or (001)NiMn can be used for the layer on top of CrRu layer to induce the $L1_0$ phase FePt at low deposition temperature.
  c. The composite layer with FePt layer can be deposited first after the electrode and CrRu or other underlayer such as $L1_0$ phase AuCu.
  d. Sputtering and then with a post-annealing process Body center tetragonal (BCT) phased FeCo layer for the composite free layer can be prepared by the following methods but not limited thereto:
  a. Deposit (002) textured BCT FeCo film on (002) textured body center cubic (bcc) phased FeCoB/(001) textured MgO/(002) textured FeCoB(002) by using CrRu or other BCC phase (002) textured seedlayer and/or underlayer directly.
  b. Sputtering and then with a post-annealing process $Fe_{16}N_2$ ordered film with high magnetization value for the composite free layer can be prepared by the following methods but not limited thereto:
  a. Deposit (002) textured $Fe_{16}N_2$ film on (002) textured body center cubic (bcc) phased FeCoB/(001) textured MgO/(002) textured FeCoB(002) by using CrRu or other BCC phase (002) textured seedlayer and/or underlayer directly.
  b. Sputtering and then with a post-annealing process In some embodiments, the sub-free layer 18, which connects to the barrier layer 24 (in MTJ case) (or the Cu layer (in GMR case)) and the layer 20 are one layer and comprise the layer 20. That is, the sub-free layer that is not connected to the barrier layer 24, for example, the second sub-free layer (or the layer 14) is eliminated. This causes an asymmetric situation for the current induced switching. For the MRAM application, this asymmetric case will be critical to adjust the non-symmetry between the critical switching current from parallel to anti-parallel (referring to free layer magnetization direction) and the critical switching current from anti-parallel to parallel (free layer magnetization direction).

The memory element 10's structure can be integrated with semiconductor and/or magnetic semiconductor devices such diodes or transistors. Other applications include integration with the magnetic nanowires and nanotubes. Others include use as magnetic random access memory cell for information storage. The composite free layer consists of sub free layers and magnetic grains with low switching field and functions as the storage layer with magnetization switching from one direction to another. The composite free layer can be perpendicular and longitudinal magnetized. Yet others include use for spin torque transfer random access memory cell (Spin-RAM). The composite free layer functions as the storage layer with magnetization switching from one status to another status. Multilevel or multistage storage is realized by selectively controlling the magnetic nano-current-channels which can be designed with different switching field. In operation, by passing a proper controllable current through a device made of the memory element 10, the device can be used for generating microwave with high power efficiency and or power. An array of such devices can be made for generating microwave for different purpose such as communication. This structure can be used for generating high efficient spin waves for communication devices and/or for magnetic logic devices, spin transistors and magnetic processors.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A magnetic memory element comprising:
   a bottom electrode;
   a composite free layer including a first free sub-layer formed on top of the bottom electrode, a nano-current-channel (NCC) layer formed on top of the first free sub-layer, and a second free sub-layer formed on top of the NCC layer, the first and second free sub-layers being made of the same material, grains of a substantially cylindrical shape dispersed throughout the NCC layer and surrounded by a matrix, the composite free layer responsive to a switching current when the switching current is applied to and flows bidirectionally through the layers of the magnetic memory element, the first free sub-layer and the second free sub-layer being exchange coupled to the grains, each of the grains having a magnetic moment and the magnetic moment of each of the grains switching locally and within the grain when switching current flows through the magnetic memory element thereby reducing the switching current, the grains made of a conducting material having high spin polarization ratio and being magnetically soft;
   a barrier layer formed on top of the composite free layer;
   a fixed layer formed on top of the barrier layer; and
   a top electrode formed on top of the fixed layer,
   wherein when switching current is applied, in a direction that is substantially perpendicular to the layers of the memory element, local magnetic moments of the NCC layer switch the state of the memory element.

2. A magnetic memory element, as recited in claim 1, wherein the fixed layer and the composite free layer each have perpendicular magnetocrystalline anisotropy.

3. A magnetic memory element, as recited in claim 1, wherein the second free sub-layer is non-nickel based.

4. A magnetic memory element, as recited in claim 1, wherein the top and bottom electrodes are each made of copper (Cu) or aluminum (Al).

5. A magnetic memory element, as recited in claim 1, wherein each of the first and second free sub-layers is made of an alloy selected from a group consisting of: cobalt iron (CoFe), iron (Fe), iron nickel (FeNi), iron cobalt nickel (FeCoNi), iron platinum (FePt), $Fe_3Pt$, cobalt platinum (CoPt), $Co_3Pt$, and multi-layers of cobalt and palladium.

6. A magnetic memory element, as recited in claim 5, wherein each of the first and second free sub-layers is further made of a material selected from a group consisting of: Boron (B), nitrogen (N), carbon (C), and silicon (Si).

7. A magnetic memory element, as recited in claim 1, wherein the grains are made of magnetically soft material.

8. A magnetic memory element, as recited in claim 1, wherein the matrix is made of an insulating material.

9. A magnetic memory element, as recited in claim 1, wherein the grains are made of iron silicon (FeSi).

10. A magnetic memory element, as recited in claim 1, wherein the matrix is made of silicon dioxide ($SiO_2$).

11. A magnetic memory element, as recited in claim 1, wherein the NCC layer is made of a material selected from a group consisting of: magnesium oxide (MgO), silicon dioxide (SiO$_2$), titanium dioxide (TiO$_2$), and alumina (Al$_2$O$_3$).

12. A magnetic memory element, as recited in claim 1, wherein the barrier layer is made of magnesium oxide (MgO).

13. A magnetic memory element, as recited in claim 12, wherein the barrier layer is further made of a thin layer of magnesium (Mg).

14. A magnetic memory element, as recited in claim 1, wherein the barrier layer is made of a material selected from a group consisting of: aluminum oxide (Al$_2$O$_3$), titanium dioxide (TiO$_2$), and germanium (Ge).

15. A magnetic memory element, as recited in claim 1, wherein the fixed layer is made of a material selected from a group consisting of: cobalt iron (CoFe), iron (Fe), iron nickel (FeNi), iron cobalt nickel (FeCoNi), iron platinum (FePt), Fe$_3$Pt, cobalt platinum (CoPt), Co$_3$Pt, multi-layers of cobalt and palladium [Co/Pd]$_n$, and cobalt nickel [Co/Ni]$_n$.

16. A magnetic memory element, as recited in claim 15, wherein the fixed layer is further made of a material selected from a group consisting of: Boron (B), nitrogen (N), carbon (C), silicon (Si) or any other element that has low solubility in the foregoing elements.

17. A magnetic memory element, as recited in claim 1, wherein the composite free layer is made of a material selected from a group consisting of: chemically ordered L10 phase FePt, CoPt, chemically ordered bct-structured FeCo, ordered Fe16N2, [Co/Pt]n an [Co/Pd]n where 'n' is an integer.

18. A magnetic memory element, as recited in claim 1, further including a pinning layer formed on top of the fixed layer and below the top electrode.

19. A magnetic memory element, as recited in claim 18, wherein the pinning layer is made of a material selected from a group consisting of: iridium manganese (IrMn), Platinum manganese (PtMn), and nickel manganese (NiMn).

20. A magnetic memory element, as recited in claim 1, further including a seed layer formed on top of the bottom electrode and below the composite free layer.

21. A magnetic memory element, as recited in claim 20, wherein the seed layer is made of CrRu.

22. A magnetic memory element comprising:
a composite free layer including a first free sub-layer, a nano-current-channel (NCC) layer formed on top of the first free sub-layer, and a second free sub-layer formed on top of the NCC layer, the first and second free sub-layers being made of the same material, the NCC having grains dispersed throughout the NCC layer and surrounded by a matrix, the composite free layer responsive to a switching current when the switching current is applied to and flows bidirectionally through the layers of the magnetic memory element, each of the grains having a magnetic moment and the magnetic moment of each of the grains switching locally and within the grain when switching current flows through the magnetic memory element, the grains made of a conducting material having high spin polarization ratio;
a barrier layer formed on top of the composite free layer;
a fixed layer formed on top of the barrier layer; and
wherein when switching current is applied, in a direction that is substantially perpendicular to the layers of the memory element, local magnetic moments of the NCC layer switch the state of the memory element.

23. A magnetic memory element, as recited in claim 22, wherein each of the first and second free sub-layers is made of an alloy selected from a group consisting of: cobalt iron (CoFe), iron (Fe), iron nickel (FeNi), iron cobalt nickel (FeCoNi), iron platinum (FePt), Fe$_3$Pt, cobalt platinum (CoPt), Co$_3$Pt, and multi-layers of cobalt and palladium.

24. A magnetic memory element, as recited in claim 22, wherein each of the first and second free sub-layers is further made of a material selected from a group consisting of: Boron (B), nitrogen (N), carbon (C), and silicon (Si).

25. A magnetic memory element, as recited in claim 22, wherein the grains are made of magnetically soft material.

26. A magnetic memory element, as recited in claim 22, wherein the matrix is made of an insulating material.

27. A magnetic memory element, as recited in claim 22, wherein the grains are made of iron silicon (FeSi).

28. A magnetic memory element, as recited in claim 22, wherein the matrix is made of silicon dioxide (SiO$_2$).

29. A magnetic memory element, as recited in claim 22, wherein the NCC layer is made of a material selected from a group consisting of: magnesium oxide (MgO), silicon dioxide (SiO$_2$), titanium dioxide (TiO$_2$), and alumina (Al$_2$O$_3$).

* * * * *